(12) United States Patent
Komuro et al.

(10) Patent No.: US 7,078,984 B2
(45) Date of Patent: Jul. 18, 2006

(54) DUPLEXER AND METHOD OF MANUFACTURING SAME

(75) Inventors: Eiju Komuro, Tokyo (JP); Katsuhiko Gunji, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/486,719

(22) PCT Filed: Feb. 26, 2003

(86) PCT No.: PCT/JP03/02125

§ 371 (c)(1),
(2), (4) Date: Feb. 13, 2004

(87) PCT Pub. No.: WO03/073611

PCT Pub. Date: Sep. 4, 2003

(65) Prior Publication Data

US 2004/0196116 A1    Oct. 7, 2004

(30) Foreign Application Priority Data

Feb. 27, 2002  (JP) ............................. 2002-051126
Feb. 25, 2003  (JP) ............................. 2003-046693

(51) Int. Cl.
*H03H 9/70* (2006.01)
*H03H 9/54* (2006.01)

(52) U.S. Cl. ...................... 333/133; 333/189; 310/312

(58) Field of Classification Search ........ 333/186–192, 333/133; 310/312
See application file for complete search history.

(56) References Cited

U.S. PATENT DOCUMENTS

| | | | |
|---|---|---|---|
| 3,838,366 A | 9/1974 | Coussot | 333/192 |
| 5,185,589 A | 2/1993 | Krishnaswamy et al. | 333/133 |
| 6,262,637 B1 | 7/2001 | Bradley et al. | 333/133 |
| 6,278,342 B1 | 8/2001 | Ella | 333/189 |
| 6,307,447 B1 * | 10/2001 | Barber et al. | 333/189 |
| 6,407,649 B1 | 6/2002 | Tikka et al. | 333/133 |
| 6,472,954 B1 * | 10/2002 | Ruby et al. | 333/133 |
| 6,518,860 B1 * | 2/2003 | Ella et al. | 333/189 |
| 6,566,979 B1 * | 5/2003 | Larson et al. | 333/187 |
| 6,657,517 B1 * | 12/2003 | Barber et al. | 333/187 |
| 6,741,145 B1 * | 5/2004 | Tikka et al. | 333/133 |
| 2001/0038322 A1 | 11/2001 | Komazaki et al. | 333/133 |
| 2001/0054941 A1 | 12/2001 | Shibata et al. | 333/189 |

FOREIGN PATENT DOCUMENTS

| | | |
|---|---|---|
| JP | A 2-113616 | 4/1990 |
| JP | A 2000-278078 | 10/2000 |
| JP | 4 2000-341077 | 12/2000 |
| JP | A 2002-237738 | 8/2002 |
| JP | A 2002-268644 | 9/2002 |
| JP | A 2003-87086 | 3/2003 |

* cited by examiner

Primary Examiner—Barbara Summons
(74) Attorney, Agent, or Firm—Oliff & Berridge, PLC

(57) ABSTRACT

A duplexer (1) comprises a chip (10) including a transmission filter (97) for passing a transmission signal therethrough and interrupting a reception signal and a reception filter (98) for passing a reception signal therethrough and interrupting a transmission signal. Each of the transmission filter (97) and the reception filter (98) includes thin-film piezoelectric resonators (16 and 17) each of which has a piezoelectric thin film that exhibits a piezoelectric property and two excitation electrodes that are disposed on both surfaces of the piezoelectric thin film and apply an excitation voltage to the piezoelectric thin film. All of the thin-film piezoelectric resonators (16 and 17) that the transmission filter (97) and the reception filter (98) include are disposed on a single base.

10 Claims, 13 Drawing Sheets

DUPLEXER AND METHOD OF MANUFACTURING SAME

TECHNICAL FIELD

The present invention relates to a duplexer incorporating thin-film piezoelectric resonators and a method of manufacturing such a duplexer.

BACKGROUND ART

A reduction in size and an increase in usable frequency range have been sought for mobile telecommunications devices such as cellular phones that have been dramatically widespread. Accordingly, a reduction in size and an increase in usable frequency range have been desired for electronic components used in the mobile telecommunications devices, too.

Some mobile telecommunications devices comprise a duplexer for switching between a transmission signal path and a receiver signal path, which allows a single antenna to be used for both transmission and reception. Such a duplexer comprises a transmission filter for allowing a transmission signal to pass therethrough and interrupting a reception signal and a reception filter for allowing a reception signal to pass therethrough and interrupting a transmission signal.

Surface acoustic wave filters have been recently used for the filters of some of the above-described duplexers. The surface acoustic wave filters have a feature that they are usable at frequencies up to 2 gigahertz and capable of being smaller in size compared to ceramic filters. However, if the future mobile telecommunications devices are designed to be used at frequencies of 2 gigaherz and higher, there are still many technical problems to be solved to make surface acoustic wave filters capable of being used at such high frequencies.

To solve these problems, attention has been given to devices called thin-film bulk acoustic resonators (that may be hereinafter referred to as FBAR) as disclosed in Published Japanese Patent Application 2000-278078. The FBAR is a thin-film piezoelectric resonator that utilizes the resonance of a piezoelectric thin-film in the direction of its thickness. The FBAR allows variations in resonance frequency by changing the thickness of the piezoelectric thin film. It is estimated that the FBAR is capable of being used at frequencies of several gigaherz.

One of the types of filters incorporating resonators is a ladder-type filter, for example. The ladder-type filter includes a series resonator and a parallel resonator as a basic configuration. The ladder-type filter is made up of a plurality of basic configurations that are cascade-connected as required.

In general, the duplexer is fabricated in such a manner that a chip including the transmission filter and a chip including the reception filter are made separately and these chips are mounted on a packaging board for the duplexer.

However, it is required to fabricate the two types of chips and to mount the two chips on the board when the above-mentioned method is employed. The problem is that the method requires a number of steps to manufacture the duplexer.

DISCLOSURE OF THE INVENTION

It is an object of the invention to provide a duplexer capable of being fabricated through a smaller number of steps and a method of manufacturing such a duplexer.

A duplexer of the invention comprises a transmission filter for passing a transmission signal therethrough and interrupting a reception signal and a reception filter for passing a reception signal therethrough and interrupting a transmission signal, the duplexer being connected to an antenna. The duplexer further comprises a base. Each of the transmission filter and the reception filter includes thin-film piezoelectric resonators each of which has a piezoelectric thin film that exhibits a piezoelectric property and first and second excitation electrodes that are disposed on both surfaces of the piezoelectric thin film and apply an excitation voltage to the piezoelectric thin film. All of the thin-film piezoelectric resonators that the transmission filter and the reception filter include are disposed on the base. The piezoelectric thin films of all of the thin-film piezoelectric resonators are continuous.

A method of manufacturing a duplexer of the invention is a method of manufacturing the duplexer comprising a transmission filter for passing a transmission signal therethrough and interrupting a reception signal and a reception filter for passing a reception signal therethrough and interrupting a transmission signal, the duplexer being connected to an antenna. Each of the transmission filter and the reception filter includes thin-film piezoelectric resonators each of which has a piezoelectric thin film that exhibits a piezoelectric property and first and second excitation electrodes that are disposed on both surfaces of the piezoelectric thin film and apply an excitation voltage to the piezoelectric thin film. The method comprises the steps of forming the first excitation electrodes of all of the thin-film piezoelectric resonators that the transmission filter and the reception filter include on a single base; forming the piezoelectric thin films on the first excitation electrodes so that the piezoelectric thin films of all of the thin-film piezoelectric resonators are made continuous; and forming the second excitation electrodes of all of the thin-film piezoelectric resonators that the transmission filter and the reception filter include on the piezoelectric thin films.

According to the duplexer or the method of manufacturing the same of the invention, all of the thin-film piezoelectric resonators that the transmission filter and the reception filter include are disposed on the single base. As a result, according to the invention, the number of steps required for manufacturing the duplexer is smaller, compared to a duplexer manufactured through fabricating a chip including the transmission filter and a chip including the reception filter individually and mounting these chips on the packaging board.

According to the duplexer or the method of manufacturing the same of the invention, the first excitation electrodes of all of the thin-film piezoelectric resonators may be disposed on a single continuous surface. The second excitation electrodes of all of the thin-film piezoelectric resonators may be disposed on a single continuous surface.

According to the duplexer or the method of manufacturing the same of the invention, the transmission filter may include a first series resonator and a first parallel resonator that constitute a ladder-type filter circuit, each of the first series resonator and the first parallel resonator being made up of one of the thin-film piezoelectric resonators, and the reception filter may include a second series resonator and a second parallel resonator that constitute a ladder-type filter circuit, each of the second series resonator and the second parallel resonator being made up of one of the thin-film piezoelectric resonators.

In the transmission filter, the excitation electrode of the first series resonator and the excitation electrode of the first parallel resonator each disposed on one of the surfaces of the piezoelectric thin film may have different thicknesses. In the reception filter, the excitation electrode of the second series resonator and the excitation electrode of the second parallel resonator each disposed on one of the surfaces of the piezoelectric thin film may have different thicknesses. Furthermore, the difference in thickness between the excitation electrode of the first series resonator and the excitation electrode of the first parallel resonator may be equal to the difference in thickness between the excitation electrode of the second series resonator and the excitation electrode of the second parallel resonator.

The excitation electrode of the first series resonator and the excitation electrode of the first parallel resonator having the different thicknesses may be both disposed on the one of the surfaces of the piezoelectric thin film that is farther from the base, and the excitation electrode of the second series resonator and the excitation electrode of the second parallel resonator having the different thicknesses may be both disposed on the one of the surfaces of the piezoelectric thin film that is farther from the base.

Among the excitation electrode of the first series resonator and the excitation electrode of the first parallel resonator having the different thicknesses and the excitation electrode of the second series resonator and the excitation electrode of the second parallel resonator having the different thicknesses, the excitation electrode of the first series resonator may be made up of a first electrode film having a first thickness, the excitation electrode of the second series resonator may be made up of a second electrode film having a second thickness, the excitation electrode of the first parallel resonator may be made up of a layered structure of the first electrode film and a third electrode film, and the excitation electrode of the second parallel resonator may be made up of a layered structure of the second electrode film and the third electrode film.

According to the duplexer or the method of manufacturing the same of the invention, all of the thin-film piezoelectric resonators that the transmission filter and the reception filter include may further have acoustic multi-layer films, each acoustic multi-layer film being made up of a plurality of dielectric layers having different acoustic impedances. In this case, the acoustic multi-layer films of all of the thin-film piezoelectric resonators may have the same thicknesses. The acoustic multi-layer films of all of the thin-film piezoelectric resonators may be continuous.

Other and further objects, features and advantages of the invention will appear more fully from the following description.

BEST MODE FOR CARRYING OUT THE INVENTION

Preferred embodiments of the invention will now be described in detail with reference to the accompanying drawings.

FIRST EMBODIMENT

Figure 1:
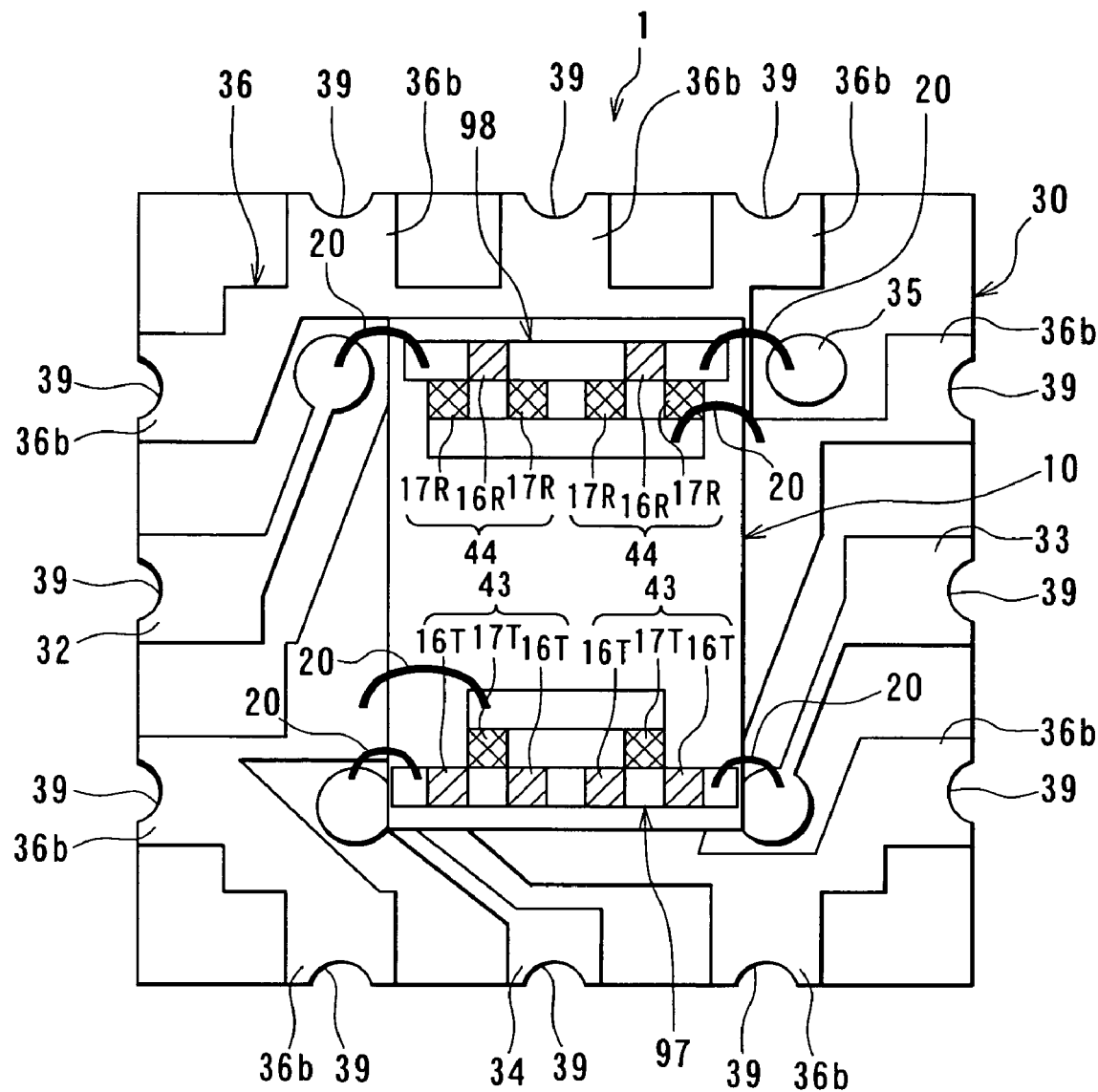
FIG. 1 is a top view of a duplexer of a first embodiment of the invention.

Reference is now made to FIG. 1 to describe the configuration of a duplexer of a first embodiment of the invention. FIG. 1 is a top view of the duplexer of the first embodiment.

As shown in FIG. 1, the duplexer 1 of this embodiment comprises: a transmission filter 97 for allowing a transmission signal to pass therethrough and interrupting a reception signal; and a reception filter 98 for allowing a reception signal to pass therethrough and interrupting a transmission signal. The duplexer 1 is connected to an antenna that is not shown. Each of the transmission filter 97 and the reception filter 98 includes a plurality of thin-film piezoelectric resonators. The thin-film piezoelectric resonators that the transmission filter 97 and the reception filter 98 include are all disposed on a single base. A chip 10 including the transmission filter 97 and the reception filter 98 has such a configuration. The duplexer 1 comprises the chip 10 and a packaging board 30 on which the chip 10 is mounted.

Figure 2:
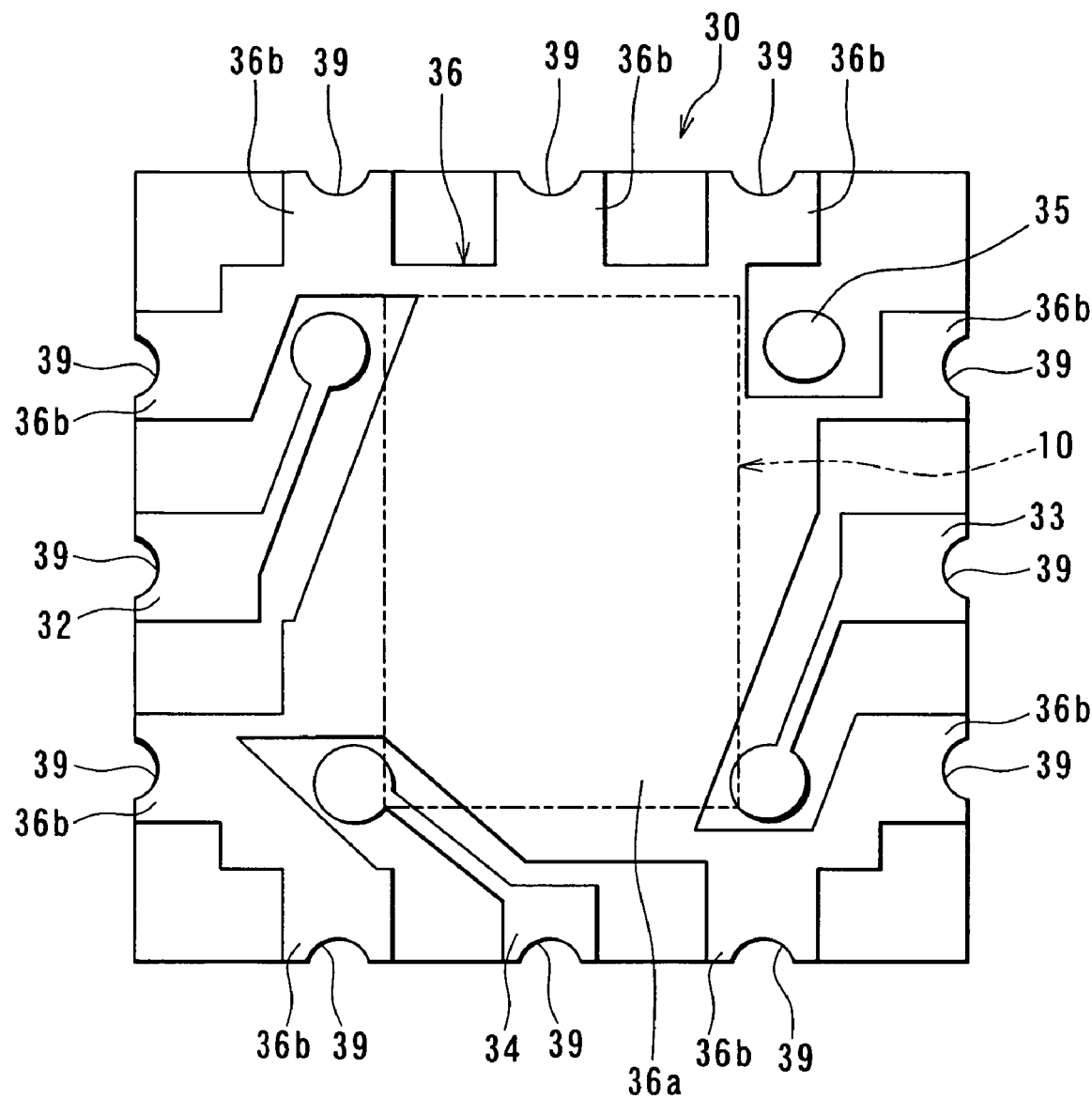
FIG. 2 is a top view of a packaging board of the first embodiment.
Figure 3:
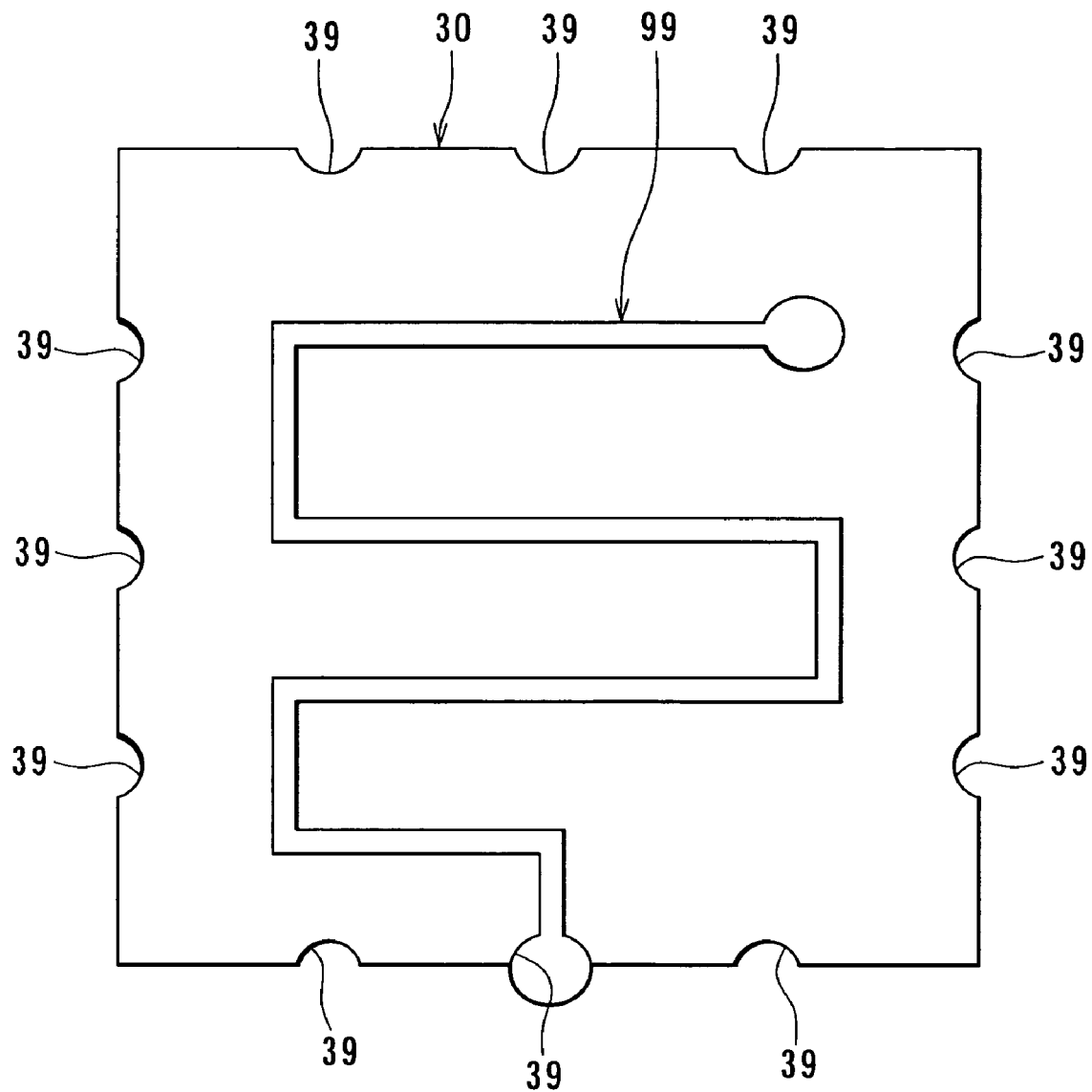
FIG. 3 is a top view of a middle layer of the packaging board of the first embodiment.

Reference is now made to FIG. 1 to FIG. 3 to describe the configuration of the packaging board 30 in detail. FIG. 2 is a top view of the packaging board 30. FIG. 3 is a top view of a middle layer of the packaging board 30. The packaging board 30 includes a plurality of stacked layers one of which is the middle layer of FIG. 3. The middle layer is located in the middle of the thickness of the packaging board 30. The packaging board 30 may have a length of 8 millimeters (mm), a width of 8 mm and a thickness of 1 mm. The packaging board 30 may be made of glass epoxy.

As shown in FIG. 1 and FIG. 2, conductors 32, 33, 34 and 35 for signals and a conductor 36 for ground are provided on the top surface of the packaging board 30. The conductor 32 extends from a neighborhood of the upper left corner of the chip 10 of FIG. 1 mounted on the board 30 to a middle of the left side of the top surface of the board 30. The conductor 33 extends from a neighborhood of the lower right corner of the chip 10 of FIG. 1 to a middle of the right side of the top surface of the board 30. The conductor 34 extends from a neighborhood of the lower left corner of the chip 10 of FIG. 1 to a middle of the lower side of the top surface of the board 30. The conductor 35 is located in a neighborhood of the upper right corner of the chip 10 of FIG. 1.

The conductor 36 for ground has: a center portion 36a formed in the center of the top surface of the packaging board 30; and a plurality of extension portions 36b extending from the center portion 36a to the periphery. The center portion 36a covers almost all of the portion of the top surface of the packaging board 30 on which the chip 10 is laid. Each of the extension portions 36b extends from the center portion 36a to one of the four sides of the top surface of the packaging board 30, being off the conductors 32, 33, 34 and 35.

The packaging board 30 has four side surfaces each of which has three end face through holes 39. The conductor 32 is electrically connected to the through hole 39 that is located in the middle of the left side of the top surface of the board 30. Similarly, the conductor 33 is electrically connected to the through hole 39 that is located in the middle of the right side of the top surface of the board 30. The conductor 34 is electrically connected to the through hole 39 that is located in the middle of the lower side of the top surface of the board 30. The extension portions 36b of the conductor 36 are electrically connected to the rest of the through holes 39, respectively.

As shown in FIG. 3, the middle layer of the packaging board 30 has a conductor that has a specific length and meanders and extends. This conductor makes up a quarter-wave phase converter 99. The quarter-wave phase converter 99 has an end that is connected to the conductor 35 that reaches the middle layer of the packaging board 30. The phase converter 99 has the other end that is connected to the conductor 34 via the through hole 39 located in the middle of the lower side of the board 30 of FIG. 3.

Each of the conductors 32, 33 and 34, the conductor 36 and the quarter-wave phase converter 99 may be made of a copper (Cu) layer on which a nickel (Ni) layer and a gold (Au) layer are stacked one by one, for example. In this case, the copper layer may have a thickness of 18 μm and the total thickness of the nickel layer and the gold layer may be 5 μm.

Figure 4:
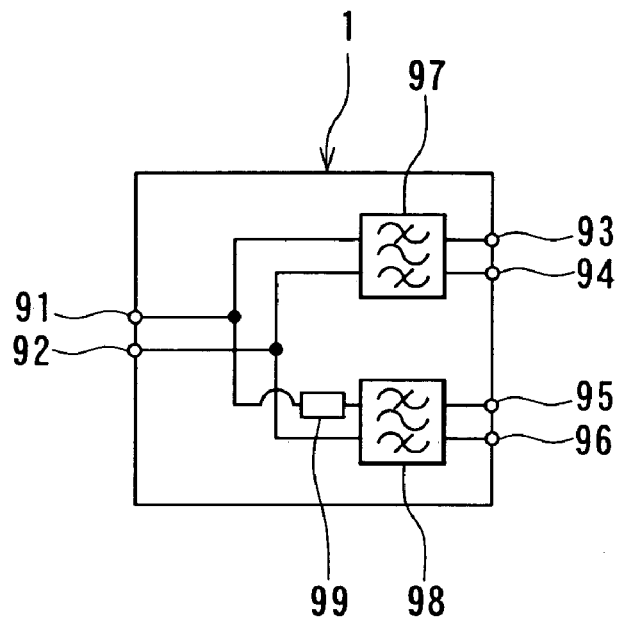
FIG. 4 is a schematic diagram that illustrates the circuit configuration of the duplexer of the first embodiment.

The circuit configuration of the duplexer 1 of the embodiment will now be described. FIG. 4 is a schematic diagram of the duplexer 1. The duplexer 1 comprises: antenna terminals 91 and 92 connected to an antenna not shown; transmission signal terminals 93 and 94 connected to a transmission circuit (not shown) that outputs a transmission signal to the antenna; and reception signal terminals 95 and 96 connected to a reception circuit (not shown) that receives a reception signal from the antenna.

The duplexer 1 further comprises: the transmission filter 97 for allowing a transmission signal to pass therethrough and interrupting a reception signal; and the reception filter 98 for allowing a reception signal to pass therethrough and interrupting a transmission signal. Each of the filters 97 and 98 has two inputs and two outputs.

The two inputs of the filter 97 are connected to the transmission signal terminals 93 and 94, respectively. The two outputs of the filter 97 are connected to the antenna terminals 91 and 92, respectively. One of the inputs of the filter 98 is connected to the antenna terminal 91 through the quarter-wave phase converter 99. The other of the inputs of the filter 98 is connected to the antenna terminal 92. The two outputs of the filter 98 are connected to the reception signal terminals 95 and 96, respectively. A transmission signal sent from the transmission circuit is given to the antenna through the filter 97. A reception signal from the antenna passes through the quarter-wave phase converter 99 at which the signal is converted to a signal whose phase is shifted only by a quarter. The signal then passes through the filter 98 and is sent to the reception circuit not shown.

The antenna terminal 91 of FIG. 4 corresponds to the conductor 34 of FIG. 1. The transmission signal terminal 93 of FIG. 4 corresponds to the conductor 33 of FIG. 1. The reception signal terminal 95 of FIG. 4 corresponds to the conductor 32 of FIG. 1. The antenna terminal 92, the transmission signal terminal 94 and the reception signal terminal 96 of FIG. 4 correspond to the conductor 36 of FIG. 1.

Figure 5:
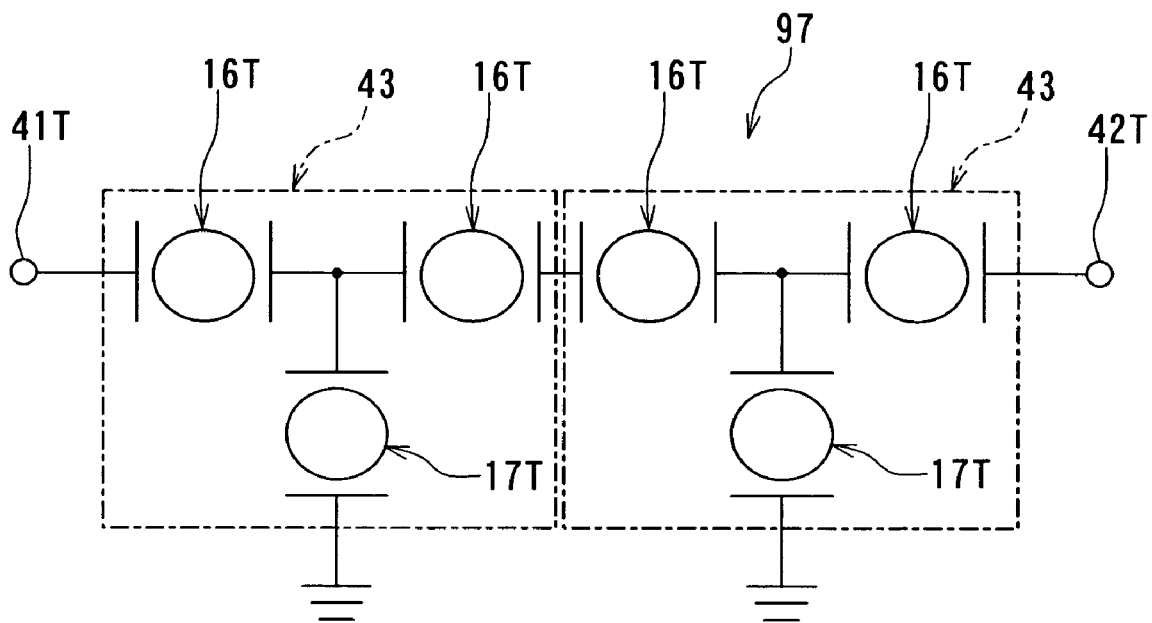
FIG. 5 is a schematic diagram that illustrates the circuit configuration of a transmission filter of the first embodiment.

The circuit configuration of the transmission filter 97 of the embodiment will now be described. FIG. 5 is a schematic diagram illustrating the circuit configuration of the transmission filter 97. As shown in FIG. 5, the filter 97 has series resonators 16T and parallel resonators 17T making up a ladder-type filter circuit. Each of the resonators 16T and 17T is made of a thin-film piezoelectric resonator. The resonators 16T and 17T correspond to the first series resonator and the first parallel resonator of the invention, respectively.

The filter 97 comprises a plurality of filter sections 43 that are cascade-connected. The number of the filter sections 43 is two, for example. Each of the two filter sections 43 has an input and an output. The input of the filter section 43 at the primary stage is connected to an input 41T of the transmission filter 97. The output of the filter section 43 at the primary stage is connected to an input of the filter section 43 at the secondary stage. The output of the filter section 43 at the secondary stage is connected to an output 42T of the transmission filter 97.

Each of the filter sections 43 has two series resonators 16T and one parallel resonator 17T. One of the series resonators 16T has an end connected to the input of the filter section 43. The one of the series resonators 16T has the other end connected to an end of the other of the series resonators 16T. The other of the series resonators 16T has the other end connected to the output of the filter section 43. The parallel resonator 17T has an end connected to the node of the two series resonators 16T. The parallel resonator 17T has the other end that is grounded.

Figure 6:
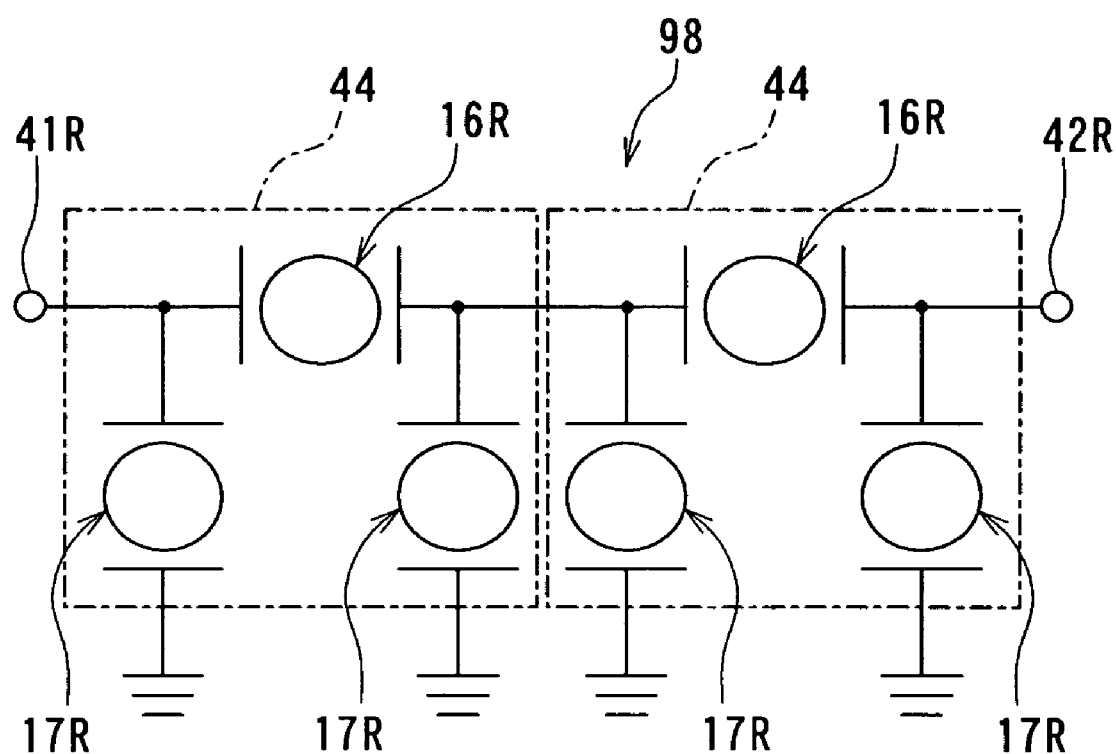
FIG. 6 is a schematic diagram that illustrates the circuit configuration of a reception filter of the first embodiment.

The circuit configuration of the reception filter 98 of the embodiment will now be described. FIG. 6 is a schematic diagram illustrating the circuit configuration of the reception filter 98. As shown in FIG. 6, the filter 98 has series resonators 16R and parallel resonators 17R making up a ladder-type filter circuit. Each of the resonators 16R and 17R is made of a thin-film piezoelectric resonator. The resonators 16R and 17R correspond to the second series resonator and the second parallel resonator of the invention, respectively.

The filter 98 comprises a plurality of filter sections 44 that are cascade-connected. The number of the filter sections 44 is two, for example. Each of the two filter sections 44 has an input and an output. The input of the filter section 44 at the primary stage is connected to an input 41R of the reception filter 98. The output of the filter section 44 at the primary stage is connected to an input of the filter section 44 at the secondary stage. The output of the filter section 44 at the secondary stage is connected to an output 42R of the reception filter 98.

Each of the filter sections 44 has one series resonator 16R and two parallel resonators 17R. The series resonator 16R has an end connected to the input of the filter section 44. The series resonator 16R has the other end connected to the output of the filter section 44. One of the parallel resonators 17R has an end connected to the input of the filter section 44. The one of the parallel resonators 17R has the other end that is grounded. The other of the parallel resonators 17R has an end connected to the output of the filter section 44, and has the other end that is grounded.

As shown in FIG. 1, the chip 10 is mounted on the packaging board 30 by face-up bonding, for example. That is, the chip 10 is disposed in such a manner that one of the surfaces from which a plurality of electrodes provided for connection are exposed faces in the direction the same as the direction in which the top surface of the packaging board 30 faces. Each of the electrodes for connection of the chip 10 is electrically connected by a bonding wire 20, for example, to a specific point of the respective one of the conductors 32 to 36 of the board 30.

Figure 7:
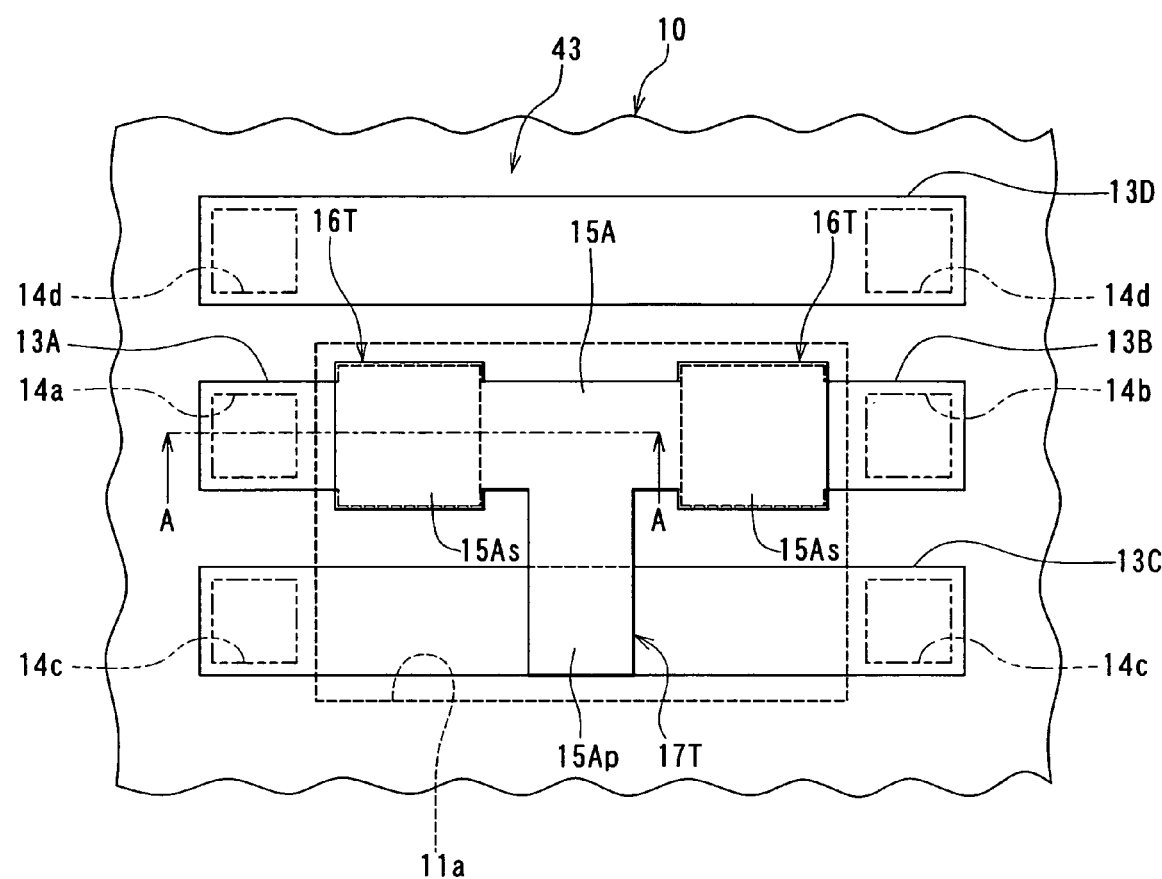
FIG. 7 is a top view of a filter section making up the transmission filter of the first embodiment.
Figure 8:
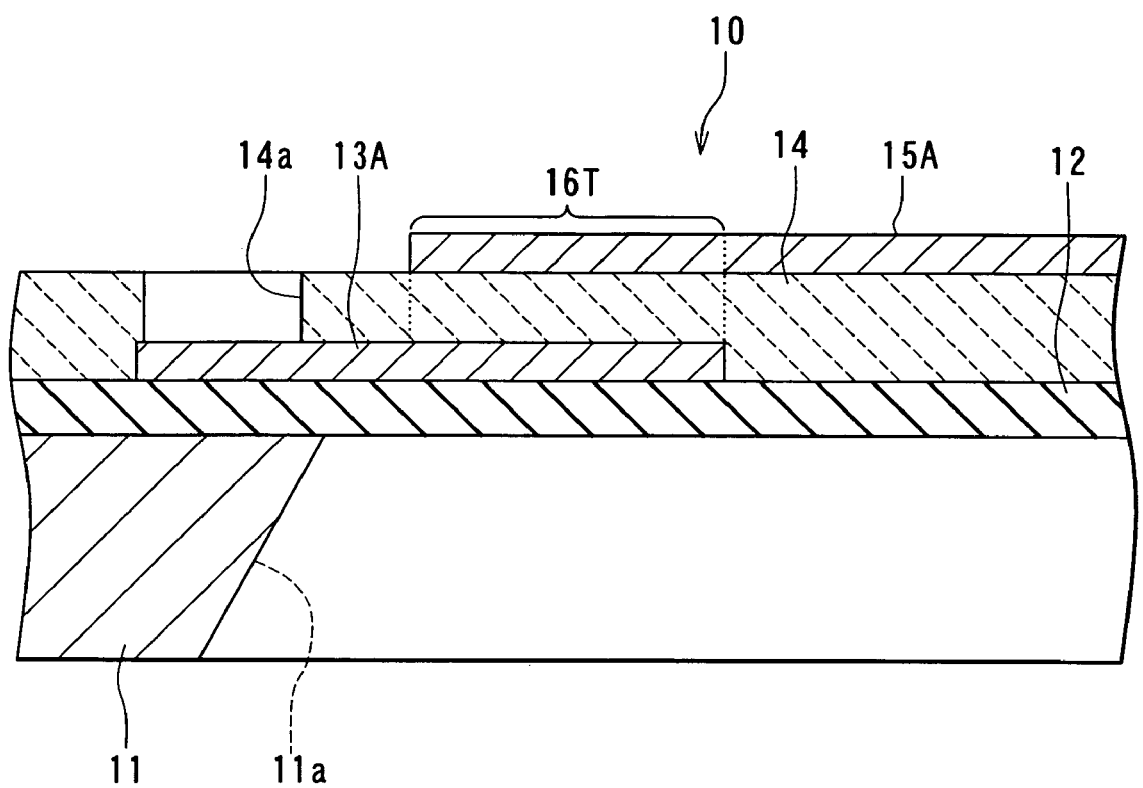
FIG. 8 is an enlarged cross-sectional view taken along line A—A of FIG. 7.

Reference is now made to FIG. 7 and FIG. 8 to describe the configuration of one of the filter sections 43 of the chip 10 in detail. FIG. 7 is a top view of the filter section 43. FIG. 8 is an enlarged cross-sectional view taken along line A—A of FIG. 7. In FIG. 8 the dimension taken in the vertical direction, that is, the thickness is greater than the dimension taken in the horizontal direction.

The chip 10 comprises a base 11 and a barrier layer 12 disposed on the base 11. The filter section 43 comprises: lower electrodes 13A to 13D disposed on the barrier layer 12; a piezoelectric thin film 14 disposed on the lower electrodes 13A to 13D; and an upper electrode 15A disposed on the piezoelectric thin film 14. In FIG. 7 the base 11 and the barrier layer 12 are omitted.

As shown in FIG. 7 and FIG. 8, the base 11 has a cavity 11a in a region in which the two series resonators 16T and the one parallel resonator 17T are located. As shown in FIG. 7, the cavity 11a seen from above is rectangle-shaped. The base 11 may be made of a Si substrate.

The barrier layer 12 is an insulating layer that separates the base 11 from the lower electrodes 13A to 13D so that the lower electrodes 13A, 13B and 13C are disposed in the region corresponding to the cavity 11a of the base 11, too. The barrier layer 12 may be made of silicon nitride ($SiN_x$).

The piezoelectric thin film 14 is a thin film that exhibits a piezoelectric property. The piezoelectric thin film 14 may be made of ZnO or AlN. Each of the lower electrodes 13A to 13D and the upper electrode 15A is mainly made of a metal and may be made of a chromium (Cr) layer on which a gold (Au) layer is stacked, for example.

The lower electrodes 13A and 13B are disposed side by side as shown in FIG. 7. The lower electrode 13C is disposed below the lower electrodes 13A and 13B as shown in FIG. 7. The lower electrode 13D is disposed above the lower electrodes 13A and 13B as shown in FIG. 7. The plane geometry of each of the lower electrodes 13A and 13B is nearly a rectangle wherein a neighborhood of end portions adjacent to each other has a width slightly greater than the other portion. The plane geometry of each of the lower electrodes 13C and 13D is a rectangle that is long in one direction. The plane geometry of the upper electrode 15A is nearly T-shaped wherein two portions facing toward the lower electrodes 13A and 13B are slightly larger than the other portion. The lower electrode 13A also functions as the input of the filter section 43. The lower electrode 13B also functions as the output of the filter section 43. The lower electrodes 13C and 13D are grounded.

When seen from above, as shown in FIG. 7, nearly a right-hand half of the lower electrode 13A is disposed in the region corresponding to the cavity 11a. Nearly a left-hand half of the lower electrode 13A is disposed outside the region corresponding to the cavity 11a. Nearly a left-hand half of the lower electrode 13B is disposed in the region corresponding to the cavity 11a. Nearly a right-hand half of the lower electrode 13B is disposed outside the region corresponding to the cavity 11a. Portions of the lower electrode 13C near both ends thereof are located outside the region corresponding to the cavity 11a. The other portion of the lower electrode 13C is located in the region corresponding to the cavity 11a. The lower electrode 13D is entirely located outside the region corresponding to the cavity 11a. The upper electrode 15A is entirely located in the region corresponding to the cavity 11a.

A portion near the right end of the lower electrode 13A is disposed to face toward a portion near the left-hand end of the upper electrode 15A, the piezoelectric thin film 14 being disposed in between. One of the series resonators 16T on the input-side of the filter section 43 is made up of the portions of the lower electrode 13A and the upper electrode 15A that are laid over each other and the portion of the piezoelectric thin film 14 disposed in between. This series resonator 16T is a thin-film piezoelectric resonator that has the piezoelectric thin film 14 exhibiting a piezoelectric property and the lower electrode 13A and the upper electrode 15A that are two excitation electrodes located on both surfaces of the piezoelectric thin film 14 for applying an excitation voltage to the piezoelectric thin film 14. Although the portions of the lower electrode 13A and the upper electrode 15A that are laid over each other are slightly different in size in FIG. 7 for convenience, these portions actually have the same dimensions.

A portion near the left end of the lower electrode 13B is disposed to face toward a portion near the right end of the upper electrode 15A, the piezoelectric thin film 14 being disposed in between. The other one of the series resonators 16T on the output-side of the filter section 43 is made up of the portions of the lower electrode 13B and the upper electrode 15A that are laid over each other and the portion of the piezoelectric thin film 14 disposed in between. As is the series resonator 16T on the input side, this series resonator 16T is a thin-film piezoelectric resonator that has the piezoelectric thin film 14 exhibiting a piezoelectric property and the lower electrode 13B and the upper electrode 15A that are two excitation electrodes located on both surfaces of the piezoelectric thin film 14 for applying an excitation voltage to the piezoelectric thin film 14. Although the portions of the lower electrode 13B and the upper electrode 15A that are laid over each other are slightly different in size in FIG. 7 for convenience, these portions actually have the same dimensions. The series resonator 16T on the output side has a cross-sectional structure the same as that of the series resonator 16T on the input side shown in FIG. 8.

A portion near the center of the lower electrode 13C is disposed to face toward a portion near the lower end of the upper electrode 15A, the piezoelectric thin film 14 being disposed in between. The parallel resonator 17T is made up of the portions of the lower electrode 13C and the upper electrode 15A that are laid over each other and the portion of the piezoelectric thin film 14 disposed in between. As is each series resonator 16T, the parallel resonator 17T is a thin-film piezoelectric resonator that has the piezoelectric thin film 14 exhibiting a piezoelectric property and the lower electrode 13C and the upper electrode 15A that are two excitation electrodes located on both surfaces of the piezoelectric thin film 14 for applying an excitation voltage to the piezoelectric thin film 14. The parallel resonator 17T has a cross-sectional structure the same as that of the series resonator 16T shown in FIG. 8.

As shown in FIG. 7, the piezoelectric thin film 14 has through holes 14a, 14b, 14c and 14d that are located in the portion corresponding to the portion near the left end of the lower electrode 13A, the portion corresponding to the portion near the right end of the lower electrode 13B, the portions corresponding to the portions near both ends of the lower electrode 13C, and the portions corresponding to the portions near both ends of the lower electrode 13D, respectively.

The lower electrode 13B of the filter section 43 at the primary stage and the lower electrode 13A of the filter section 43 at the secondary stage may be either connected to each other through a conductor not shown, or fabricated as a single element. The lower electrodes 13C of the filter section 43 at the primary stage and the filter section 43 at the secondary stage may be either connected to each other through a conductor not shown, or fabricated as a single element. Similarly, the lower electrodes 13D of the filter section 43 at the primary stage and the filter section 43 at the secondary stage may be either connected to each other through a conductor not shown, or fabricated as a single element.

The lower electrode 13A of the filter section 43 at the primary stage is connected to the conductor 33 through the bonding wire 20 that passes through the through hole 14a. The lower electrode 13B of the filter section 43 at the secondary stage is connected to the conductor 34 through the bonding wire 20 that passes through the through hole 14b. Each of the lower electrodes 13C of the two filter sections 43 is connected to the conductor 36 through the bonding wire 20 that passes through the respective one of the through holes 14c. Each of the lower electrodes 13D of the two filter sections 43 is connected to the conductor 36 through the bonding wire 20 that passes through the respective one of the through holes 14d.

The lower electrodes 13A to 13D each correspond to the first excitation electrode of the invention. The upper electrode 15A corresponds to the second excitation electrode of the invention. Each of the lower electrodes 13A to 13D and the upper electrode 15A includes a conductor layer. Hence, in each of the filter sections 43, the lower or upper electrode of each of the thin-film piezoelectric resonator is connected to the lower or upper electrode of one of the other thin-film piezoelectric resonators through the conductor layer shared between these electrodes.

Figure 9:
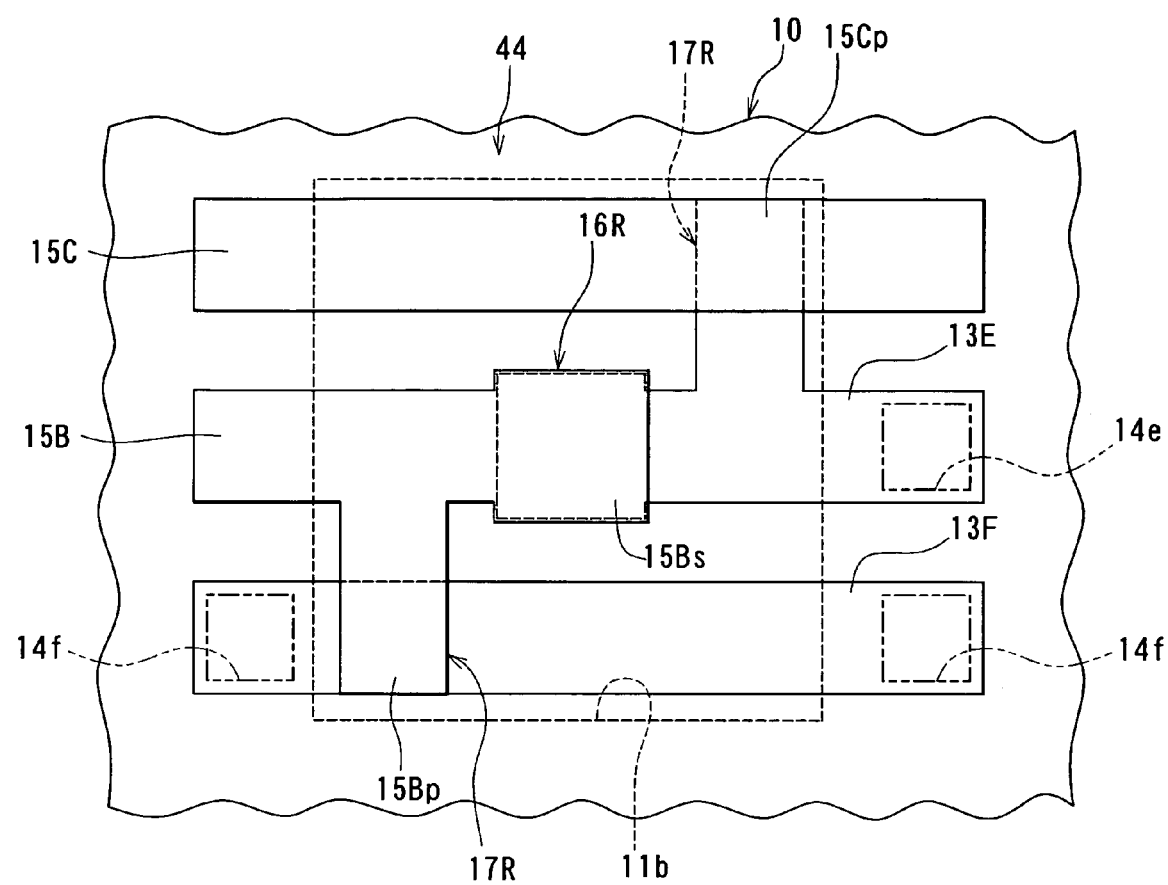
FIG. 9 is a top view of a filter section making up the reception filter of the first embodiment.

Reference is now made to FIG. 9 to describe the configuration of one of the filter sections 44 of the chip 10 in detail. FIG. 9 is a plan view of the filter section 44.

The filter section 44 comprises: lower electrodes 13E and 13F disposed on the barrier layer 12; the piezoelectric thin film 14 disposed on the lower electrodes 13E and 13F; and upper electrodes 15B and 15C disposed on the piezoelectric thin film 14. In FIG. 9 the base 11 and the barrier layer 12 are omitted.

As shown in FIG. 9, the base 11 has a cavity 11b provided in a region in which the one series resonator 16R and the two parallel resonators 17R are located. The cavity 11b seen from above is rectangle-shaped.

As the lower electrodes 13A to 13D and the upper electrode 15A of the filter section 43, each of the lower electrodes 13E and 13F and the upper electrodes 15B and 15C is mainly made of a metal and may be made of a chromium (Cr) layer on which a gold (Au) layer is stacked, for example.

The lower electrodes 13E and 13F are vertically aligned in FIG. 9. The plane geometry of the lower electrode 13E, the upper one of the electrodes, is nearly reversed T-shaped wherein a portion near the left end portion has a width slightly greater than the other portion. The plane geometry of the lower electrode 13F, the lower one of the electrodes, is a rectangle that is long in one direction. The upper electrodes 15B and 15C are vertically aligned in FIG. 9. The plane geometry of the upper electrode 15B, the lower one of the electrodes, is nearly T-shaped wherein a portion near the right end portion has a width slightly greater than the other portion. The plane geometry of the upper electrode 15C, the upper one of the electrodes, is a rectangle that is long in one direction. The lower electrode 13E also functions as the input of the filter section 44. The upper electrode 15B also functions as the output of the filter section 44. The lower electrode 13F and the upper electrode 15C are grounded.

When seen from above, as shown in FIG. 9, a portion near the right end portion of the lower electrode 13E is disposed outside the region corresponding to the cavity 11b. The other portion of the lower electrode 13E is disposed in the region corresponding to the cavity 11b. Portions of the lower electrode 13F near both ends thereof are located outside the region corresponding to the cavity 11b. The other portion of the lower electrode 13F is located in the region corresponding to the cavity 11b. A portion near the left end portion of the upper electrode 15B is disposed outside the region corresponding to the cavity 11b. The other portion of the upper electrode 15B is disposed in the region corresponding to the cavity 11b. Portions of the upper electrode 15C near both ends thereof are located outside the region corresponding to the cavity 11b. The other portion of the upper electrode 15C is located in the region corresponding to the cavity 11b.

A portion near the left end of the lower electrode 13E is disposed to face toward a portion near the right end of the upper electrode 15B, the piezoelectric thin film 14 being disposed in between. The series resonator 16R is made up of the portions of the lower electrode 13E and the upper electrode 15B that are laid over each other and the portion of the piezoelectric thin film 14 disposed in between. As is the series resonator 16T, this series resonator 16R is a thin-film piezoelectric resonator that has the piezoelectric thin film 14 exhibiting a piezoelectric property and the lower electrode 13E and the upper electrode 15B that are two excitation electrodes located on both surfaces of the piezoelectric thin film 14 for applying an excitation voltage to the piezoelectric thin film 14. The series resonator 16R has a cross-sectional structure the same as the series resonator 16T shown in FIG. 8. Although the portions of the lower electrode 13E and the upper electrode 15B that are laid over each other are slightly different in size in FIG. 9 for convenience, these portions actually have the same dimensions.

A portion near the upper end of the lower electrode 13E of FIG. 9 is disposed to face toward a portion in the middle of the upper electrode 15C, the piezoelectric thin film 14 being disposed in between. One of the parallel resonators 17R on the input side of the filter section 44 is made up of the portions of the lower electrode 13E and the upper electrode 15C that are laid over each other and the portion of the piezoelectric thin film 14 disposed in between. As is the series resonator 16T, this parallel resonator 17R is a thin-film piezoelectric resonator that has the piezoelectric thin film 14 exhibiting a piezoelectric property and the lower electrode 13E and the upper electrode 15C that are two excitation electrodes located on both surfaces of the piezoelectric thin film 14 for applying an excitation voltage to the piezoelectric thin film 14. The parallel resonator 17R has a cross-sectional structure the same as that of the series resonator 16T shown in FIG. 8.

A portion in the middle of the lower electrode 13F is disposed to face toward a portion near the lower end of the upper electrode 15B of FIG. 9, the piezoelectric thin film 14 being disposed in between. The other one of the parallel resonators 17R on the output side of the filter section 44 is made up of the portions of the lower electrode 13F and the upper electrode 15B that are laid over each other and the portion of the piezoelectric thin film 14 disposed in between. As is the series resonator 16T, the parallel resonator 17R is a thin-film piezoelectric resonator that has the piezoelectric thin film 14 exhibiting a piezoelectric property and the lower electrode 13F and the upper electrode 15B that are two excitation electrodes located on both surfaces of the piezoelectric thin film 14 for applying an excitation voltage to the piezoelectric thin film 14. The parallel resonator 17R has a cross-sectional structure the same as that of the series resonator 16T shown in FIG. 8.

As shown in FIG. 9, the piezoelectric thin film 14 has through holes 14e and 14f that are located in the portion corresponding to the portion near the right end of the lower electrode 13E and in the portions corresponding to the portions near both ends of the lower electrode 13F, respectively.

The upper electrode 15B of the filter section 44 at the primary stage is connected to the lower electrode 13E of the filter section 44 at the secondary stage through a conductor not shown and the through hole 14e. The lower electrodes 13F of the filter section 44 at the primary stage and the filter section 44 at the secondary stage may be either connected to each other through a conductor not shown, or fabricated as a single element. Similarly, the upper electrodes 15C of the filter section 44 at the primary stage and the filter section 44 at the secondary stage may be either connected to each other through a conductor not shown, or fabricated as a single element.

The lower electrode 13E of the filter section 44 at the primary stage is connected to the conductor 35 through the bonding wire 20 that passes through the through hole 14e. The upper electrode 15B of the filter section 44 at the secondary stage is connected to the conductor 32 through the bonding wire 20. Each of the lower electrodes 13F of the two filter sections 44 is connected to the conductor 36 through the bonding wire 20 that passes through the respective one of the through holes 14f. The upper electrode 15C is connected to the conductor 36 through the bonding wire 20.

The lower electrodes 13E and 13F each correspond to the first excitation electrode of the invention. The upper electrodes 15B and 15C each correspond to the second excitation electrode of the invention. Each of the lower electrodes 13E and 13F and the upper electrodes 15B and 15C include a conductor layer. Hence, in each of the filter sections 44, the lower or upper electrode of each of the thin-film piezoelectric resonators is connected to the lower or upper electrode of one of the other thin-film piezoelectric resonators through the conductor layer shared between these electrodes.

In the present embodiment the piezoelectric thin films 14 of all of the thin-film piezoelectric resonators that the transmission filter 97 and the reception filter 98 include are continuous. The piezoelectric thin films 14 that are continuous mean that the piezoelectric thin films 14 are not completely divided into a plurality of portions, and include the case in which the thin films 14 have holes such as through holes, for example.

In the embodiment the lower electrodes of all of the thin-film piezoelectric resonators that the transmission filter 97 and the reception filter 98 include are disposed on a single continuous surface. The single continuous surface means a single surface of a single continuous layer and is the top surface of the barrier layer 12 in the embodiment. The single continuous surface is not limited to a flat surface but may be a surface having small projections and depressions.

In the embodiment the upper electrodes of all of the thin-film piezoelectric resonators that the transmission filter 97 and the reception filter 98 include are disposed on a single continuous surface. The single continuous surface means a single surface of a single continuous layer and is the top surface of the piezoelectric thin film 14 in the embodiment. The single continuous surface is not limited to a flat surface but may be a surface having small projections and depressions. The upper electrodes of all of the thin-film piezoelectric resonators may be disposed on the top surface of the piezoelectric thin film 14, another continuous layer being disposed in between.

A high-frequency excitation voltage is applied to the lower and upper electrodes of each of the resonators 16T, 17T, 16R and 17R. This excitation voltage is applied to the piezoelectric thin film 14. A portion of the piezoelectric thin film 14 disposed between the lower and upper electrodes is thereby excited, and elastic waves that move in the direction of thickness of this portion are generated. This portion resonates when the frequency of the excitation voltage is a specific resonant frequency.

In the embodiment the upper electrodes of the resonators 16T, 17T, 16R and 17R have different thicknesses so that the resonators 16T, 17T, 16R and 17R have different resonant frequencies.

As shown in FIG. 7, the upper electrode 15A of the filter section 43 has: two series resonator forming portions 15As that face toward the lower electrodes 13A and 13B, respectively, and make up portions of the series resonators 16T; and a parallel resonator forming portion 15Ap that faces toward the lower electrode 13C and makes up a portion of the parallel resonators 17T. The series resonator forming portions 15As and the parallel resonator forming portion 15Ap have different thicknesses. In the embodiment thickness $t_3$ of the parallel resonator forming portion 15Ap is greater than thickness $t_1$ of each of the series resonator forming portions 15As. The difference in thickness $t_3-t_1$ is represented by $\Delta t_{31}$. The series resonator forming portions 15As each correspond to the excitation electrode of the first series resonator of the invention. The parallel resonator forming portion 15Ap corresponds to the excitation electrode of the first parallel resonator of the invention.

As shown in FIG. 9, the upper electrode 15B of the filter section 44 has: a series resonator forming portion 15Bs that faces toward the lower electrode 13E and makes up a portion of the series resonator 16R; and a parallel resonator forming portion 15Bp that faces toward the lower electrode 13F and makes up a portion of the parallel resonator 17R. The upper electrode 15C of the filter section 44 has a parallel resonator forming portion 15Cp that faces toward the lower electrode 13E and makes up a portion of the parallel resonator 17R. The series resonator forming portions 15Bs and each of the parallel resonator forming portions 15Bp and 15Cp have different thicknesses. In the embodiment each of the parallel resonator forming portions 15Bp and 15Cp has thickness $t_4$. Thickness $t_4$ is greater than thickness $t_2$ of the series resonator forming portion 15Bs. The difference in thickness $t_4-t_2$ is represented by $\Delta t_{42}$. The series resonator forming portion 15Bs corresponds to the excitation electrode of the second series resonator of the invention. The parallel resonator forming portions 15Bp and 15Cp each correspond to the excitation electrode of the second parallel resonator of the invention.

The transmission filter 97 and the reception filter 98 have different pass bands. Therefore, the above-mentioned thicknesses $t_1$ to $t_4$ are different from one another. In the embodiment, however, the difference in thickness $\Delta t_{31}$ between the parallel resonator forming portion 15Ap and the series resonator forming portion 15As is equal to the difference in thickness $\Delta t_{42}$ between each of the parallel resonator forming portions 15Bp and 15Cp and the series resonator forming portion 15Bs.

Examples of dimensions of the elements of the duplexer 1 of the embodiment will now be given. According to these examples, in each of the filter sections 43 and 44, the piezoelectric thin film 14 has a thickness of 0.9 μm, and each of the lower electrodes 13A to 13F has a thickness of 100 nm. In the filter section 43 the series resonator 16T has a length of 150 μm and a width of 150 μm, and the parallel resonator 17T has a length of 185 μm and a width of 185 μm. In the filter section 44 the series resonator 16R has a length of 100 μm and a width of 100 μm, and the parallel resonator 17R has a length of 143 μm and a width of 143 μm. The series resonator forming portion 15As has a thickness $t_1$ of 90 nm. The parallel resonator forming portion 15Ap has a thickness $t_3$ of 105 nm. The series resonator forming portion 15Bs has a thickness $t_2$ of 55 nm. Each of the parallel resonator forming portions 15Bp and 15Cp has a thickness $t_4$ of 70 nm. The differences in thickness $\Delta t_3$, and $\Delta t_{42}$ are each 15 nm.

A method of manufacturing the duplexer 1 of the embodiment will now be described. The method comprises the steps of fabricating the chip 10; fabricating the packaging board 30; and mounting the chip 10 on the packaging board 30. As shown in FIG. 1, the chip 10 is disposed to face upward so that one of the surfaces from which a plurality of electrodes for connection are exposed faces in the same direction as the top surface of the packaging board 30.

In such a manner the packaged duplexer 1 is manufactured. The duplexer 1 is soldered to another board at the neighborhood of the end face through hole 39 of the board 30 so as to be electrically connected to the other board and mechanically fixed thereto.

A specific example of the step of fabricating the chip 10 of the embodiment will now be described. In this step a Si substrate that was oriented to have a (100) surface was utilized as the base 11. A silicon nitride ($SiN_x$) film having a thickness of 200 nm was formed by chemical vapor deposition (CVD) on each of the top (front) surface and the bottom (back) surface of the base 11. The silicon nitride film formed on the top surface of the base 11 served as the upper barrier layer 12 while the silicon nitride film formed on the bottom surface of the base 11 served as the lower barrier layer not shown.

Next, a plurality of openings (not shown) were formed in the lower barrier layer by photolithography and dry etching. The lower barrier layer was to be used as a mask for etching to make the cavities 11a and 11b in the base 11.

Next, the lower electrodes 13A to 13F of all of the thin-film piezoelectric resonators that the transmission filter 97 and the reception filter 98 included were formed on the top surface of the barrier layer 12. In this example the barrier layer 12 had a flat top surface. As a result, the lower electrodes 13A to 13F of all of the thin-film piezoelectric resonators were disposed in one plane. The lower electrodes 13A to 13F were formed by lift-off as described below, wherein a Cr layer having a thickness of about 5 nm was formed and an Au layer having a thickness of about 100 nm was then formed. That is, a patterned resist having openings formed in the regions in which the lower electrodes 13A to 13F were to be made was formed by photolithography on the top surface of the barrier layer 12. Next, the Cr layer having a thickness of about 5 nm was formed and the Au layer having a thickness of about 100 nm was then formed each by sputtering to cover the patterned resist. Next, the patterned resist was removed, and the Cr layer and the Au layer formed in the openings of the patterned resist were provided as the lower electrodes 13A to 13F.

Next, a ZnO layer having a thickness of about 0.9 μm was formed by sputtering to cover the lower electrodes 13A to 13F so as to form the piezoelectric thin films 14, so that the piezoelectric thin films 14 of all of the thin-film piezoelectric resonators that the transmission filter 97 and the reception filter 98 included were made continuous. Next, portions of the piezoelectric thin films 14 were removed through the use of acetic acid to form the through holes 14a to 14f.

Next, the upper electrodes 15A to 15C of all of the thin-film piezoelectric resonators that the transmission filter 97 and the reception filter 98 included were formed by lift-off on the top surfaces of the piezoelectric thin films 14. This step of forming the upper electrodes 15A to 15C will be described in detail later.

After the formation of the upper electrodes 15A to 15C was completed, the base 11 was etched from the bottom (back) surface through the use of KOH, using the lower barrier layer as a mask, to form the cavities 11a and 11b. Anisotropic etching was performed with KOH on the base 11 made of the Si substrate that was oriented to have the (100) surface. As a result, the base 11 was made to have the cavities 11a and 11b each of which had a shape in which the width gradually increased toward the bottom.

The step of forming the upper electrodes 15A to 15C of the embodiment will now be described in detail. This step includes the steps of forming a first electrode film in the region of the filter section 43 in which the upper electrode 15A is to be formed, the first electrode film having a first thickness and a plane geometry the same as that of the upper electrode 15A; forming a second electrode film in the region of the filter section 44 in which the upper electrodes 15B and 15C are to be formed, the second electrode film having a second thickness and a plane geometry the same as that of each of the upper electrodes 15B and 15C; and forming a third electrode film in the regions in which the parallel resonator forming portion 15Ap of the upper electrode 15A and the parallel resonator forming portions 15Bp and 15Cp of the upper electrodes 15B and 15C are to be formed, the third electrode film having a third thickness and a plane geometry the same as those of the parallel resonator forming portions 15Ap, 15Bp and 15Cp. These three steps may be performed in any order. The first electrode film corresponds to the conductor layer shared among the upper electrodes of the two thin-film piezoelectric resonators 16T and the single thin-film piezoelectric resonator 17T. The second electrode film having the same plane geometry as the upper electrode 15B corresponds to the conductor layer shared between the upper electrodes of the single thin-film piezoelectric resonator 16R and the single thin-film piezoelectric resonator 17R.

According to the embodiment, as thus described, the upper electrode (the series resonator forming portion 15As) of the series resonator 16T of the transmission filter 97 is made of the first electrode film having the first thickness. The upper electrode (the series resonator forming portion 15Bs) of the series resonator 16R of the reception filter 98 is made of the second electrode film having the second thickness. The upper electrode (the parallel resonator forming portion 15Ap) of the parallel resonator 17T of the transmission filter 97 is made of the layered structure made up of the first and third electrode films. The upper electrode (the parallel resonator forming portions 15Bp and 15Cp) of the parallel resonator 17R of the reception filter 98 is made of the layered structure made up of the second and third electrode films. In such a manner, according to the embodiment, the four types of upper electrodes having different thicknesses are formed through the three film-forming steps.

The layers such as the Cr layer for establishing close contact between the upper electrodes 15A to 15C and the layer below are formed first, regardless of the order in which the above-mentioned three steps are performed.

Figure 10:
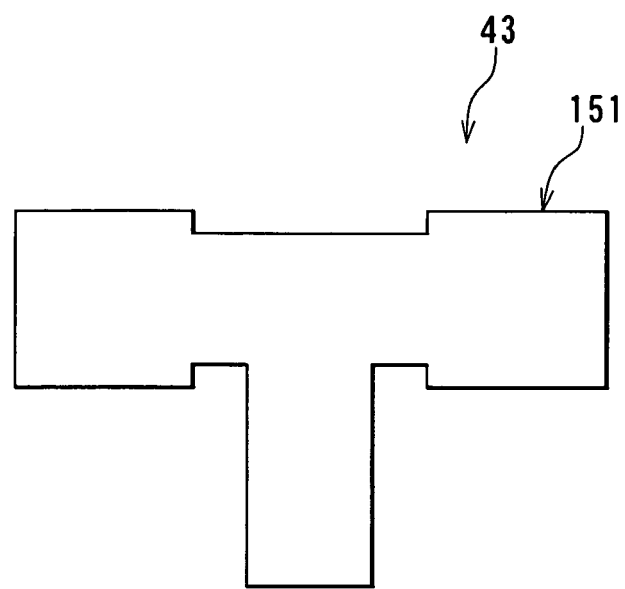
FIG. 10 illustrates a step of a method of manufacturing the duplexer of the first embodiment.

Reference is now made to FIG. 10 to FIG. 13 to describe a specific example of the steps of forming the upper electrodes 15A to 15C. In this example a patterned resist was first formed by photolithography on the top surface of the piezoelectric thin film 14, the resist having an opening that had a shape corresponding to the upper electrode 15A of the filter section 43. Next, the first electrode film 151 having a thickness of 90 nm was formed by sputtering to cover the patterned resist. The resist was then removed and, as shown in FIG. 10, the first electrode film 151 was formed in the region in which the upper electrode 15A was to be formed. The first electrode film 151 was patterned to have a plane geometry the same as that of the upper electrode 15A.

Figure 11:
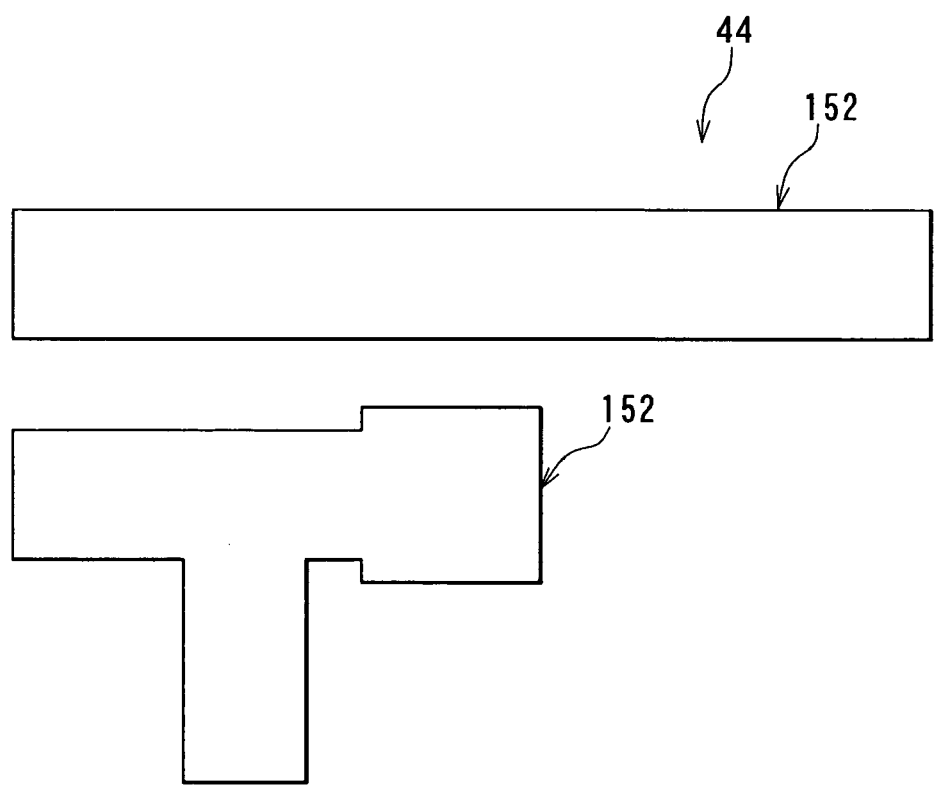
FIG. 11 illustrates a step that follows the step shown in FIG. 10.

Next, a patterned resist was formed by photolithography on the top surfaces of the first electrode film 151 and the piezoelectric thin film 14, the resist having openings that had shapes corresponding to the upper electrodes 15B and 15C of the filter section 44. Next, the second electrode film 152 having a thickness of 55 nm was formed by sputtering to cover the patterned resist. The resist was then removed and, as shown in FIG. 11, the second electrode film 152 was formed in the region in which the upper electrodes 15B and 15C were to be formed. The second electrode film 152 was patterned to have a plane geometry the same as those of the upper electrodes 15B and 15C.

Figure 12:
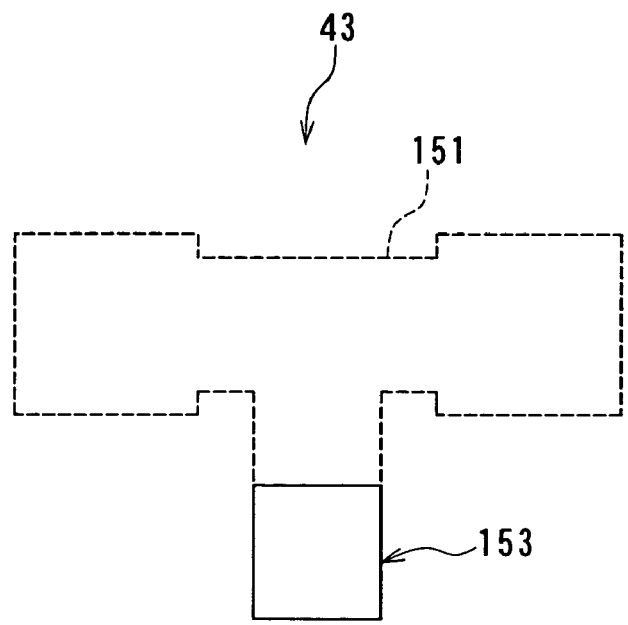
FIG. 12 illustrates a step that follows the step shown in FIG. 11.
Figure 13:
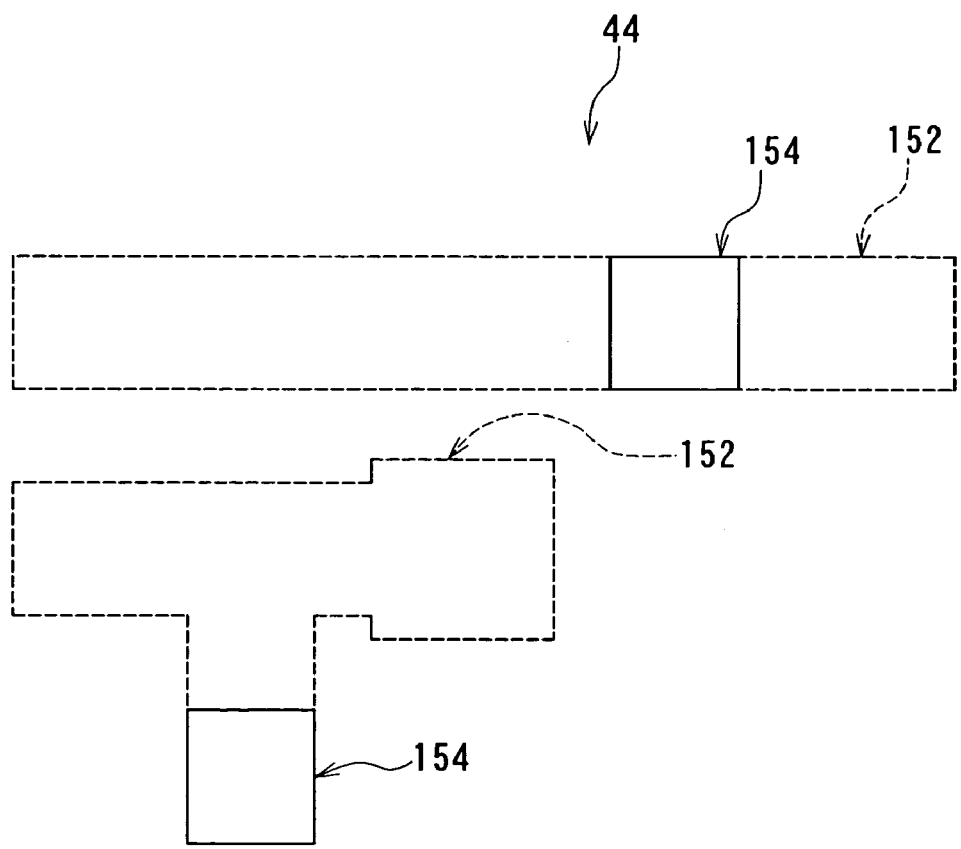
FIG. 13 illustrates a step that is performed at the same time as the step shown in FIG. 12.

Next, a patterned resist was formed by photolithography on the top surfaces of the first electrode film 151, the second electrode film 152 and the piezoelectric thin film 14, the resist having openings that had shapes corresponding to the parallel resonator forming portion 15Ap of the filter section 43 and the parallel resonator forming portions 15Bp and 15Cp of the filter section 44. Next, the third electrode films 153 and 154 each having a thickness of 15 nm were formed by sputtering to cover the patterned resist. The resist was then removed and, as shown in FIG. 12, the third electrode film 153 was formed in the region in which the parallel resonator forming portion 15Ap was to be formed. The third electrode film 153 was patterned to have a plane geometry the same as that of the parallel resonator forming portion 15Ap. At the same time, as shown in FIG. 13, the third electrode film 154 was formed in the region in which the parallel resonator forming portions 15Bp and 15Cp were to be formed. The third electrode film 154 was patterned to have a plane geometry the same as those of the parallel resonator forming portions 15Bp and 15Cp. In such a manner the layered structure made up of the first electrode film 151 and the third electrode film 153 and having a thickness of 105 nm was formed, and at the same time the layered structure made up of the second electrode film 152 and the third electrode film 154 and having a thickness of 70 nm was formed.

In this example the upper electrode (the series resonator forming portion 15As) of the series resonator 16T of the transmission filter 97 was made of the first electrode film 151. The upper electrode (the series resonator forming portion 15Bs) of the series resonator 16R of the reception filter 98 was made of the second electrode film 152. The upper electrode (the parallel resonator forming portion 15Ap) of the parallel resonator 17T of the transmission filter 97 was made of the layered structure made up of the first electrode film 151 and the third electrode film 153. The upper electrode (the parallel resonator forming portions 15Bp and 15Cp) of the parallel resonator 17R of the reception filter 98 was made of the layered structure made up of the second electrode film 152 and the third electrode film 154. In such a manner, according to this example, the four types of upper electrodes having different thicknesses were formed through the three film-forming steps.

Figure 14:
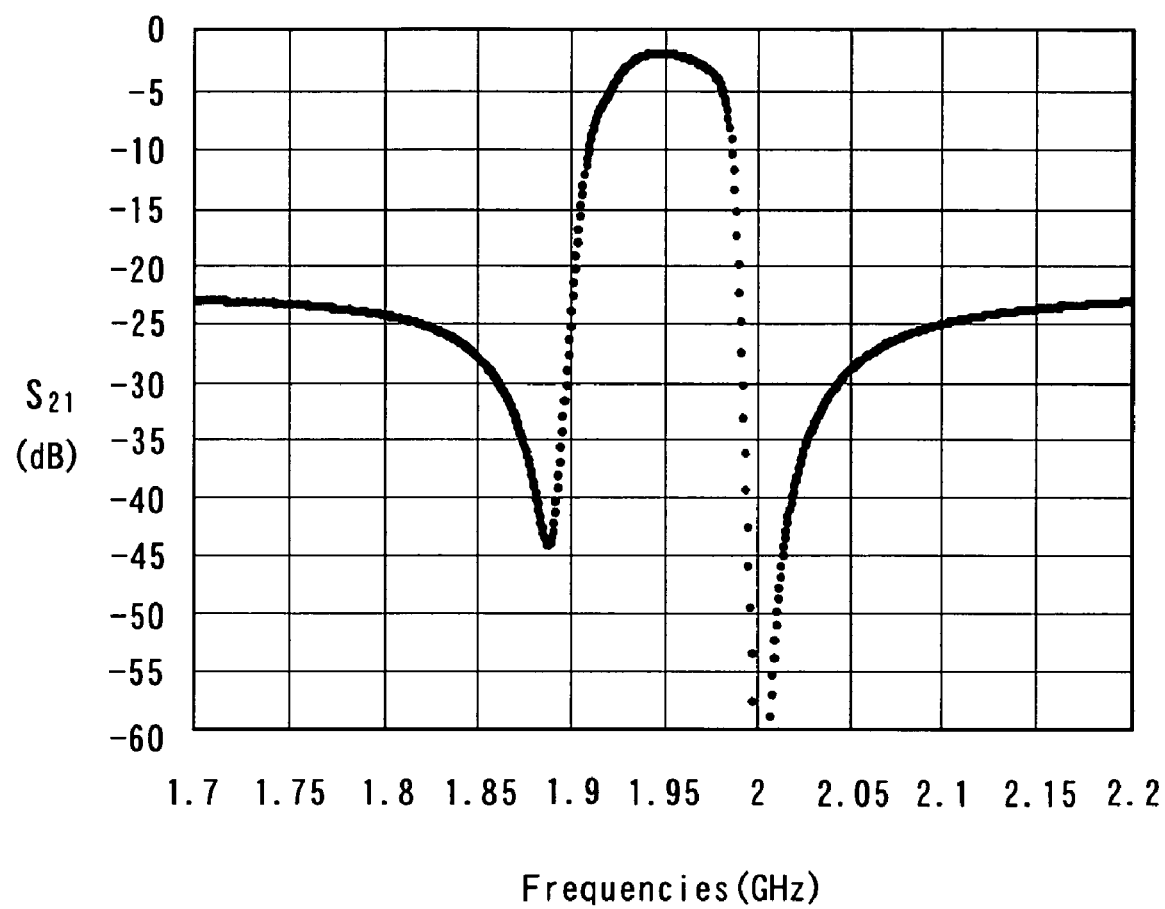
FIG. 14 is a plot showing a characteristic of the transmission filter of the first embodiment.
Figure 15:
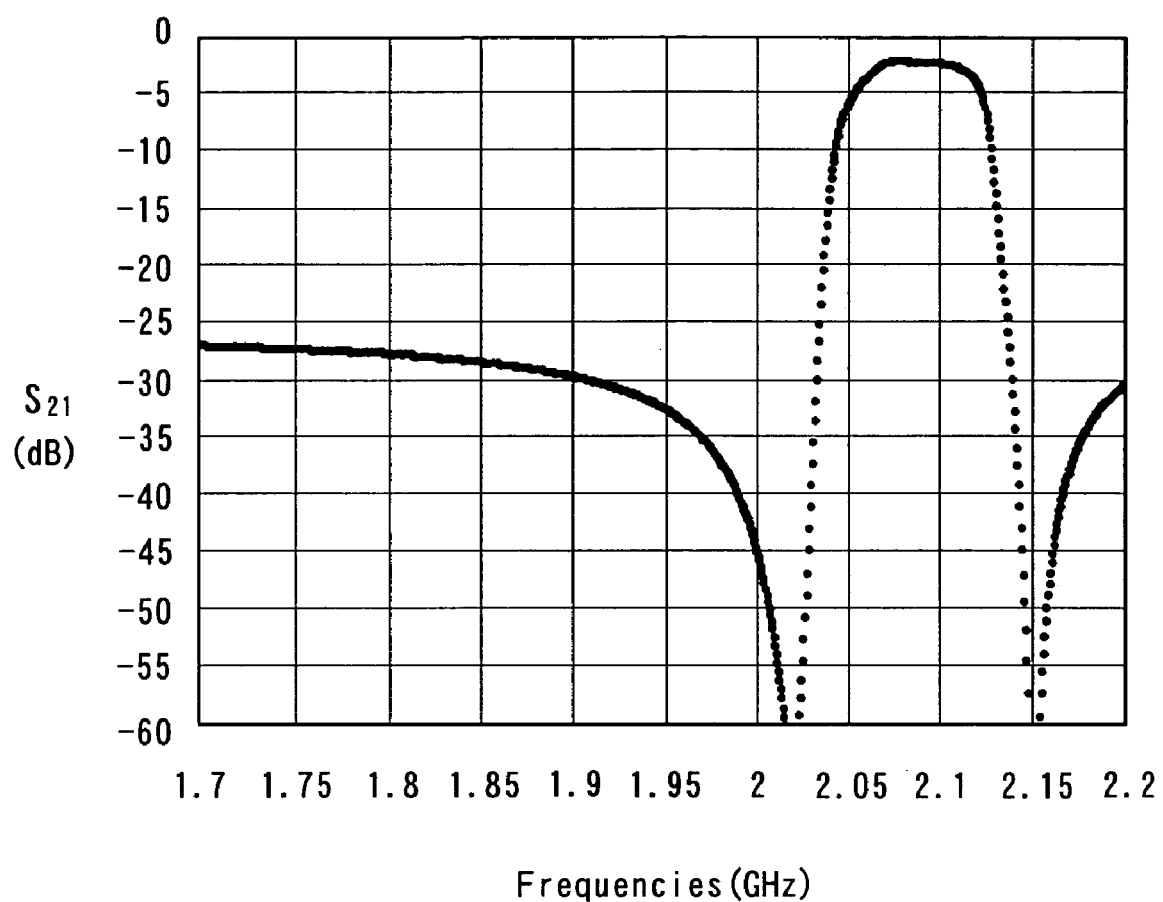
FIG. 15 is a plot showing a characteristic of the reception filter of the first embodiment.

FIG. 14 shows an example of a desired characteristic of the transmission filter 97. FIG. 15 shows an example of a desired characteristic of the reception filter 98. FIG. 14 and FIG. 15 show the frequency characteristics of parameter $S_{21}$ that indicates the transmission characteristics (the amount of attenuation) of the filter circuits making up the transmission filter 97 and the reception filter 98, respectively. According to the embodiment, the filter characteristics of the transmission filter 97 and the reception filter 98 as shown in FIG. 14 and FIG. 15 are designed through simulation, for example. In this case, the thickness of each of the lower electrodes 13A to 13F and the piezoelectric thin film 14, and the dimensions of the lower electrodes 13A to 13F and the upper electrodes 15A to 15C are optimized, so that the difference in thickness between the upper electrode (the series resonator forming portion 15As) of the series resonator 16T and the upper electrode (the parallel resonator forming portion 15Ap) of the parallel resonator 17T of the transmission filter 97 is equal to the difference in thickness between the upper electrode (the series resonator forming portion 15Bs) of the series resonator 16R and the upper electrode (the parallel resonator forming portions 15Bp and 15Cp) of the parallel resonator 17R of the reception filter 98.

According to the embodiment as thus described, the series resonators 16T and 16R and the parallel resonators 17T and 17R that the transmission filter 97 and the reception filter 98 include are all disposed on the single base 11, so that the transmission filter 97 and the reception filter 98 are provided in the single chip 10. As a result, according to the embodiment, the number of steps required for fabricating the chip is smaller, compared to the case in which a chip including the transmission filter 97 and a chip including the reception filter 98 are individually fabricated. In addition, according to the embodiment, the number of chips to be fabricated is smaller, so that the number of times of cutting the wafer to obtain chips is smaller, compared to the case in which a chip including the transmission filter 97 and a chip including the reception filter 98 are individually fabricated. Furthermore, according to the embodiment, it is only required to mount the single chip 10 on the packaging board 30 of the duplexer 1, so that the number of steps required is smaller, compared to the case in which two chips or more are mounted. Owing to the features of the embodiment thus described, it is possible to manufacture the duplexer 1 through a reduced number of steps.

According to the embodiment, the piezoelectric thin films 14 of all of the thin-film piezoelectric resonators that the transmission filter 97 and the reception filter 98 include are continuous. As a result, it is not necessary to pattern the piezoelectric thin films 14 to be divided for the respective piezoelectric resonators. It is therefore possible to manufacture the duplexer through a smaller number of steps.

According to the embodiment, the lower electrodes of all of the thin-film piezoelectric resonators that the transmission filter 97 and the reception filter 98 include are disposed on the single continuous surface. This facilitates formation of the lower electrodes.

According to the embodiment, the upper electrodes of all of the thin-film piezoelectric resonators that the transmission filter 97 and the reception filter 98 include are disposed on the single continuous surface. This facilitates formation of the upper electrodes.

According to the embodiment, the difference $\Delta t_{31}$ between thickness $t_3$ of the parallel resonator forming portion 15Ap and thickness $t_1$ of the series resonator forming portion 15As of the transmission filter 97 is equal to the difference $\Delta t_{42}$ between thickness $t_4$ of each of the parallel resonator forming portions 15Bp and 15Cp and thickness $t_2$ of the series resonator forming portion 15Bs. As a result, it is possible to form the first electrode film having thickness $t_1$ through the first film-forming step, then to form the second electrode film having thickness $t_2$ through the second film-forming step, and to form the third electrode films having a thickness corresponding to the difference $\Delta t_{31}$ ($\Delta t_{42}$) through the third film-forming step on portions of the first electrode film having thickness $t_1$ and the second electrode film having thickness $t_2$, respectively, so that the four types of upper electrodes having different thicknesses are formed though the three film-forming steps. It is thereby possible to manufacture the duplexer 1 through a smaller number of steps.

SECOND EMBODIMENT

Figure 16:
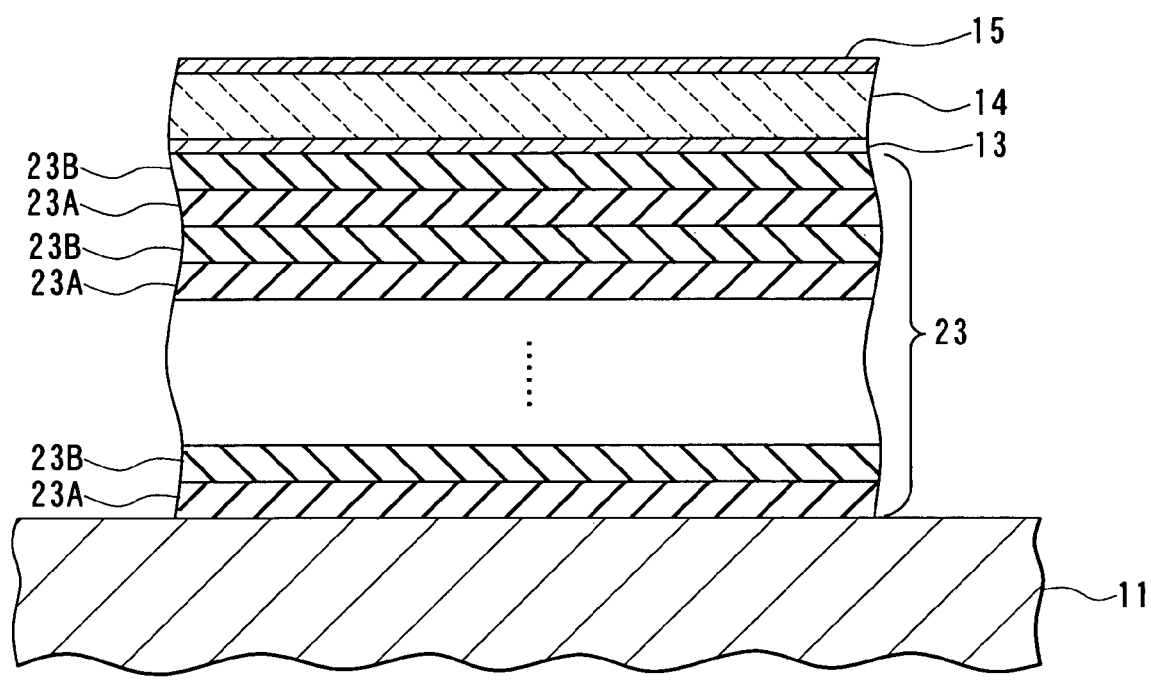
FIG. 16 is a cross-sectional view of a thin-film piezoelectric resonator of a second embodiment of the invention.

Reference is now made to FIG. 16 to describe a duplexer and a method of manufacturing the same of a second embodiment of the invention. FIG. 16 is a cross-sectional view that represents all of the thin-film piezoelectric resonators that the transmission filter 97 and the reception filter 98 of the embodiment include. In FIG. 16 numeral 13 represents the lower electrodes 13A to 13F, and numeral 15 represents the upper electrodes 15A to 15C. According to the duplexer of the second embodiment, each of the thin-film piezoelectric resonators that the transmission filter 97 and the reception filter 98 include has an acoustic multi-layer film 23 made up of a plurality of dielectric layers having different acoustic impedances. The acoustic multi-layer film 23 is disposed between the base 11 and each of the lower electrodes 13. In the second embodiment the base 11 has no cavity 11a.

The acoustic multi-layer film 23 is made up of first dielectric layers 23A made of a dielectric material having a high acoustic impedance and second dielectric layers 23B made of a dielectric material having a low acoustic impedance, the first dielectric layers 23A and the second dielectric layers 23B being alternately stacked. The first dielectric layers 23A may be made of any of AlN, ZnO and $Al_2O_3$, for example. The second dielectric layers 23B may be made of $SiO_2$, for example.

The acoustic multi-layer film 23 has a function of confining the elastic wave generated by each of the piezoelectric thin films 14 inside each of the piezoelectric thin films 14. Each of the dielectric layers 23A and 23B has a thickness that is fixed around a quarter of the wavelength inside each of the dielectric layers 23A and 23B that corresponds to the resonant frequency.

According to the embodiment, the acoustic multi-layer films 23 of all of the thin-film piezoelectric resonators that the transmission filter 97 and the reception filter 98 include have the same thicknesses. The acoustic multi-layer films 23 of all of the thin-film piezoelectric resonators that the transmission filter 97 and the reception filter 98 include are continuous. The remainder of configuration of the duplexer of the second embodiment is similar to that of the first embodiment.

The method of manufacturing the duplexer of the second embodiment includes the step of forming the acoustic multi-layer films 23 of all of the thin-film piezoelectric resonators that the transmission filter 97 and the reception filter 98 include on the base 11, which is performed prior to the step of forming the lower electrodes 13. The lower electrodes 13 are formed on the acoustic multi-layer films 23. The remainder of steps of the method of manufacturing the duplexer of the second embodiment are similar to those of the first embodiment.

According to the second embodiment, each of the acoustic multi-layer films 23 does not include any metal layer but is made up of only a plurality of dielectric layers having different acoustic impedances. If each of the acoustic multi-layer films 23 includes a metal layer, a great capacitance would be created between the metal layer and the lower electrode of each of the thin-film piezoelectric resonators, unless the acoustic multi-layer films 23 would be patterned to have a plane geometry the same as that of each of the thin-film piezoelectric resonators. This capacitance would produce an undesirable parasitic capacitive coupling from one of the resonators to the other of the resonators. However, if the acoustic multi-layer films 23 were patterned, a difference in level would be created between the portions in which the acoustic multi-layer films 23 would exist and not exist, and it would be difficult to form the other layers of the thin-film piezoelectric resonators on the acoustic multi-layer films 23 with stability. According to the embodiment, in contrast, each of the acoustic multi-layer films 23 is made up of only a plurality of dielectric layers. As a result, the acoustic multi-layer films 23 of all of the thin-film piezoelectric resonators are formed to be continuous without having the above-mentioned parasitic capacitive coupling. It is thereby possible to manufacture the duplexer through a reduced number of steps with reliability.

A preferred thickness of each of the acoustic multi-layer films 23 depends on the resonant frequency of each of the thin-film piezoelectric resonators. However, there is only a small difference in resonant frequencies among the thin-film piezoelectric resonators used in the transmission filter 97 and the reception filter 98 of the duplexer. For a duplexer for the use in a frequency band around 2 GHz, for example, the difference in resonant frequencies among the thin-film piezoelectric resonators is of the order of 80 MHz which is about 4% of the resonant frequencies. Therefore, it is not necessary to make the acoustic multi-layer films 23 having different thicknesses for the thin-film piezoelectric resonators to obtain a characteristic sufficient for a duplexer. Hence, according to the embodiment, the acoustic multi-layer films 23 of all of the thin-film piezoelectric resonators that the transmission filter 97 and the reception filter 98 include have the same thicknesses. It is thereby possible to manufacture the duplexer through a reduced number of steps with reliability.

The piezoelectric thin films 14 may be made of ZnO or AlN, for example. The temperature coefficient of the elastic constant of these materials is negative. In contrast, the temperature coefficient of the elastic constant of $SiO_2$ is positive. Consequently, if the second dielectric layers 23B of the acoustic multi-layer films 23 are made of $SiO_2$ in the embodiment, the second dielectric layers 23B have the function of the temperature compensating layer that makes the temperature coefficient of the resonant frequency of each of the thin-film piezoelectric resonators near zero. The temperature coefficient of the resonant frequency means the rate of change in resonant frequency with respect to changes in temperature.

The remainder of configuration, function and effects of the second embodiment are similar to those of the first embodiment.

The present invention is not limited to the foregoing embodiments but may be practiced in still other ways. For example, the method of mounting the chip on the package board is not limited to face-up bonding but may be face-down bonding such as flip chip bonding.

According to the duplexer or the method of manufacturing the same of the invention thus described, all of the piezoelectric thin films that the transmission filter and the reception filter include are disposed on the single base. As a result, according to the invention, the number of steps required for manufacturing the duplexer is smaller, compared to a duplexer manufactured through fabricating a chip including the transmission filter and a chip including the reception filter individually and mounting these chips on the package board. In addition, according to the invention, the piezoelectric thin films of all of the thin-film piezoelectric resonators are continuous. As a result, it is not necessary to pattern the piezoelectric thin films to be divided for the respective piezoelectric resonators. It is therefore possible to manufacture the duplexer through a smaller number of steps.

According to the duplexer or the method of manufacturing the same of the invention, the first excitation electrodes of all of the thin-film piezoelectric resonators may be disposed on a single continuous surface. This facilitates formation of the first excitation electrodes.

According to the duplexer or the method of manufacturing the same of the invention, the second excitation electrodes of all of the thin-film piezoelectric resonators are disposed on a single continuous surface. This facilitates formation of the second excitation electrodes.

According to the duplexer or the method of manufacturing the same of the invention, the transmission filter may include the first series resonator and the first parallel resonator that constitute the ladder-type filter circuit, each of the first series resonator and the first parallel resonator being made up of one of the thin-film piezoelectric resonators, and the reception filter may include the second series resonator and the second parallel resonator that constitute the ladder-type filter circuit, each of the second series resonator and the second parallel resonator being made up of one of the thin-film piezoelectric resonators. In the transmission filter, the excitation electrode of the first series resonator and the excitation electrode of the first parallel resonator each disposed on one of the surfaces of the piezoelectric thin film may have different thicknesses. In the reception filter, the excitation electrode of the second series resonator and the excitation electrode of the second parallel resonator each disposed on one of the surfaces of the piezoelectric thin film may have different thicknesses. Furthermore, the difference in thickness between the excitation electrode of the first series resonator and the excitation electrode of the first parallel resonator may be equal to the difference in thickness between the excitation electrode of the second series resonator and the excitation electrode of the second parallel resonator. In this case, it is possible to form the four types of excitation electrodes having different thicknesses though the three film-forming steps. It is thereby possible to manufacture the duplexer through a smaller number of steps.

According to the duplexer or the method of manufacturing the same of the invention, all of the thin-film piezoelectric resonators that the transmission filter and the reception filter include may have acoustic multi-layer films, each acoustic multi-layer film being made up of a plurality of dielectric layers having different acoustic impedances. The acoustic multi-layer films of all of the thin-film piezoelectric resonators may have the same thicknesses. In this case, it is possible to manufacture the duplexer through a reduced number of steps with reliability. In addition, the acoustic multi-layer films of all of the thin-film piezoelectric resonators may be continuous. In this case, it is possible to manufacture the duplexer through a reduced number of steps with reliability, too.

Obviously many modifications and variations of the present invention are possible in the light of the above teachings. It is therefore to be understood that within the scope of the appended claims the invention may be practiced otherwise than as specifically described.

What is claimed is:

1. A duplexer comprising a transmission filter for passing a transmission signal therethrough and interrupting a reception signal and a reception filter for passing a reception signal therethrough and interrupting a transmission signal, the duplexer being connected to an antenna, wherein:

the duplexer further comprises a base;

each of the transmission filter and the reception filter includes thin-film piezoelectric resonators each of which has a piezoelectric thin film that exhibits a piezoelectric property and first and second excitation electrodes that are disposed on both surfaces of the piezoelectric thin film and apply an excitation voltage to the piezoelectric thin film;

all of the thin-film piezoelectric resonators that the transmission filter and the reception filter include are disposed on the base;

the piezoelectric thin films of all of the thin-film piezoelectric resonators are continuous;

the transmission filter includes a first series resonator and a first parallel resonator that constitute a ladder-type filter circuit, each of the first series resonator and the first parallel resonator being made up of one of the thin-film piezoelectric resonators;

the reception filter includes a second series resonator and a second parallel resonator that constitute a ladder-type filter circuit, each of the second series resonator and the second parallel resonator being made up of one of the thin-film piezoelectric resonators;

in the transmission filter, the excitation electrode of the first series resonator and the excitation electrode of the first parallel resonator each disposed on one of the surfaces of the piezoelectric thin film have different thicknesses;

in the reception filter, the excitation electrode of the second series resonator and the excitation electrode of the second parallel resonator each disposed on one of the surfaces of the piezoelectric thin film have different thicknesses; and the difference in thickness between the excitation electrode of the first series resonator and the excitation electrode of the first parallel resonator is equal to the difference in thickness between the excitation electrode of the second series resonator and the excitation electrode of the second parallel resonator.

2. The duplexer according to claim 1, wherein the excitation electrode of the first series resonator and the excitation electrode of the first parallel resonator having the different thicknesses are both disposed on the one of the surfaces of the piezoelectric thin film that is farther from the base, and the excitation electrode of the second series resonator and the excitation electrode of the second parallel resonator having the different thicknesses are both disposed on the one of the surfaces of the piezoelectric thin film that is farther from the base.

3. The duplexer according to claim 1, wherein, among the excitation electrode of the first series resonator and the excitation electrode of the first parallel resonator having the different thicknesses and the excitation electrode of the second series resonator and the excitation electrode of the second parallel resonator having the different thicknesses, the excitation electrode of the first series resonator is made up of a first electrode film having a first thickness, the excitation electrode of the second series resonator is made up of a second electrode film having a second thickness, the excitation electrode of the first parallel resonator is made up of a layered structure of the first electrode film and a third electrode film, and the excitation electrode of the second parallel resonator is made up of a layered structure of the second electrode film and the third electrode film.

4. A duplexer comprising a transmission filter for passing a transmission signal therethrough and interrupting a reception signal and a reception filter for passing a reception signal therethrough and interrupting a transmission signal, the duplexer being connected to an antenna, wherein:
the duplexer further comprises a base;
each of the transmission filter and the reception filter includes thin-film piezoelectric resonators each of which has a piezoelectric thin film that exhibits a piezoelectric property and first and second excitation electrodes that are disposed on both surfaces of the piezoelectric thin film and apply an excitation voltage to the piezoelectric thin film;
all of the thin-film piezoelectric resonators that the transmission filter and the reception filter include are disposed on the base;
the piezoelectric thin films of all of the thin-film piezoelectric resonators are continuous;
all of the thin-film piezoelectric resonators that the transmission filter and the reception filter include further have acoustic multi-layer films, each acoustic multi-layer film being made up of a plurality of dielectric layers having different acoustic impedances; and
the acoustic multi-layer films of all of the thin-film piezoelectric resonators have the same thicknesses.

5. A duplexer comprising a transmission filter for passing a transmission signal therethrough and interrupting a reception signal and a reception filter for passing a reception signal therethrough and interrupting a transmission signal, the duplexer being connected to an antenna, wherein:
the duplexer further comprises a base;
each of the transmission filter and the reception filter includes thin-film piezoelectric resonators each of which has a piezoelectric thin film that exhibits a piezoelectric property and first and second excitation electrodes that are disposed on both surfaces of the piezoelectric thin film and apply an excitation voltage to the piezoelectric thin film;
all of the thin-film piezoelectric resonators that the transmission filter and the reception filter include are disposed on the base;
the piezoelectric thin films of all of the thin-film piezoelectric resonators are continuous;
all of the thin-film piezoelectric resonators that the transmission filter and the reception filter include further have acoustic multi-layer films, each acoustic multi-layer film being made up of a plurality of dielectric layers having different acoustic impedances; and
the acoustic multi-layer films of all of the thin-film piezoelectric resonators are continuous.

6. A method of manufacturing a duplexer comprising a transmission filter for passing a transmission signal therethrough and interrupting a reception signal and a reception filter for passing a reception signal therethrough and interrupting a transmission signal, the duplexer being connected to an antenna, wherein each of the transmission filter and the reception filter includes thin-film piezoelectric resonators each of which has a piezoelectric thin film that exhibits a piezoelectric property and first and second excitation electrodes that are disposed on both surfaces of the piezoelectric thin film and apply an excitation voltage to the piezoelectric thin film, the method comprising the steps of:
forming the first excitation electrodes of all of the thin-film piezoelectric resonators that the transmission filter and the reception filter include on a single base;
forming the piezoelectric thin films on the first excitation electrodes so that the piezoelectric thin films of all of the thin-film piezoelectric resonators are made continuous; and
forming the second excitation electrodes of all of the thin-film piezoelectric resonators that the transmission filter and the reception filter include on the piezoelectric thin films, wherein:
the transmission filter is made to include a first series resonator and a first parallel resonator that constitute a ladder-type filter circuit, each of the first series resonator and the first parallel resonator being made up of one of the thin-film piezoelectric resonators;
the reception filter is made to include a second series resonator and a second parallel resonator that constitute a ladder-type filter circuit, each of the second series resonator and the second parallel resonator being made up of one of the thin-film piezoelectric resonators;
in the transmission filter, the excitation electrode of the first series resonator and the excitation electrode of the first parallel resonator each disposed on one of the surfaces of the piezoelectric thin film are made to have different thicknesses;
in the reception filter, the excitation electrode of the second series resonator and the excitation electrode of the second parallel resonator each disposed on one of the surfaces of the piezoelectric thin film are made to have different thicknesses; and
the difference in thickness between the excitation electrode of the first series resonator and the excitation electrode of the first parallel resonator is made to be equal to the difference in thickness between the excitation electrode of the second series resonator and the excitation electrode of the second parallel resonator.

7. The method according to claim 6, wherein the excitation electrode of the first series resonator and the excitation electrode of the first parallel resonator having the different thicknesses are both disposed on the one of the surfaces of the piezoelectric thin film that is farther from the base, and the excitation electrode of the second series resonator and the excitation electrode of the second parallel resonator having the different thicknesses are both disposed on the one of the surfaces of the piezoelectric thin film that is farther from the base.

8. The method according to claim 6, wherein, among the excitation electrode of the first series resonator and the excitation electrode of the first parallel resonator having the different thicknesses and the excitation electrode of the second series resonator and the excitation electrode of the second parallel resonator having the different thicknesses, the excitation electrode of the first series resonator is made up of a first electrode film having a first thickness, the excitation electrode of the second series resonator is made up of a second electrode film having a second thickness, the excitation electrode of the first parallel resonator is made up of a layered structure of the first electrode film and a third electrode film, and the excitation electrode of the second parallel resonator is made up of a layered structure of the second electrode film and the third electrode film.

9. A method of manufacturing a duplexer comprising a transmission filter for passing a transmission signal therethrough and interrupting a reception signal and a reception filter for passing a reception signal therethrough and interrupting a transmission signal, the duplexer being connected to an antenna, wherein each of the transmission filter and the reception filter includes thin-film piezoelectric resonators each of which has a piezoelectric thin film that exhibits a piezoelectric property and first and second excitation electrodes that are disposed on both surfaces of the piezoelectric thin film and apply an excitation voltage to the piezoelectric thin film, the method comprising the steps of:

forming the first excitation electrodes of all of the thin-film piezoelectric resonators that the transmission filter and the reception filter include on a single base;

forming the piezoelectric thin films on the first excitation electrodes so that the piezoelectric thin films of all of the thin-film piezoelectric resonators are made continuous; and forming the second excitation electrodes of all of the thin-film piezoelectric resonators that the transmission filter and the reception filter include on the piezoelectric thin films, wherein:

all of the thin-film piezoelectric resonators that the transmission filter and the reception filter include are made to further have acoustic multi-layer films, each acoustic multi-layer film being made up of a plurality of dielectric layers having different acoustic impedances;

the method further comprises the step of forming the acoustic multi-layer films of all of the thin-film piezoelectric resonators that the transmission filter and the reception filter include on the base, the step being performed before the step of forming the first excitation electrodes;

the first excitation electrodes are formed on the acoustic multi-layer films; and the acoustic multi-layer films of all of the thin-film piezoelectric resonators are made to have the same thicknesses.

10. A method of manufacturing a duplexer comprising a transmission filter for passing a transmission signal therethrough and interrupting a reception signal and a reception filter for passing a reception signal therethrough and interrupting a transmission signal, the duplexer being connected to an antenna, wherein each of the transmission filter and the reception filter includes thin-film piezoelectric resonators each of which has a piezoelectric thin film that exhibits a piezoelectric property and first and second excitation electrodes that are disposed on both surfaces of the piezoelectric thin film and apply an excitation voltage to the piezoelectric thin film, the method comprising the steps of:

forming the first excitation electrodes of all of the thin-film piezoelectric resonators that the transmission filter and the reception filter include on a single base;

forming the piezoelectric thin films on the first excitation electrodes so that the piezoelectric thin films of all of the thin-film piezoelectric resonators are made continuous; and forming the second excitation electrodes of all of the thin-film piezoelectric resonators that the transmission filter and the reception filter include on the piezoelectric thin films, wherein:

all of the thin-film piezoelectric resonators that the transmission filter and the reception filter include are made to further have acoustic multi-layer films, each acoustic multi-layer film being made up of a plurality of dielectric layers having different acoustic impedances;

the method further comprises the step of forming the acoustic multi-layer films of all of the thin-film piezoelectric resonators that the transmission filter and the reception filter include on the base, the step being performed before the step of forming the first excitation electrodes;

the first excitation electrodes are formed on the acoustic multi-layer films; and the acoustic multi-layer films of all of the thin-film piezoelectric resonators are made to be continuous.

* * * * *